(12) United States Patent
Kadous

(10) Patent No.: US 8,908,496 B2
(45) Date of Patent: Dec. 9, 2014

(54) INCREMENTAL REDUNDANCY TRANSMISSION IN A MIMO COMMUNICATION SYSTEM

(75) Inventor: Tamer Kadous, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1553 days.

(21) Appl. No.: 10/801,624

(22) Filed: Mar. 15, 2004

(65) Prior Publication Data

US 2005/0052991 A1   Mar. 10, 2005

Related U.S. Application Data

(60) Provisional application No. 60/501,777, filed on Sep. 9, 2003, provisional application No. 60/531,391, filed on Dec. 18, 2003.

(51) Int. Cl.
*G01R 31/08* (2006.01)
*H04L 1/18* (2006.01)
(Continued)

(52) U.S. Cl.
CPC ............ *H04L 1/1819* (2013.01); *H04L 5/0048* (2013.01); *H04L 1/0048* (2013.01); *H04L 1/1671* (2013.01); *H04L 1/0618* (2013.01); *H04L 1/0071* (2013.01); *H04L 1/0009* (2013.01); *H04L 1/0003* (2013.01); *H04L 1/005* (2013.01); *H04L 27/2626* (2013.01); *H04L 5/0023* (2013.01); *H04L 27/2647* (2013.01); *H03M 13/33* (2013.01)
USPC ............................ 370/216; 370/329; 370/344

(58) Field of Classification Search
USPC .......... 370/216, 335, 349, 394, 329; 375/267, 375/219, 335, 394, 349, 358
See application file for complete search history.

(56) References Cited

U.S. PATENT DOCUMENTS

| 5,625,876 A | 4/1997 | Gilhousen et al. |
| 6,304,593 B1 * | 10/2001 | Alouini et al. ............... 375/216 |

(Continued)

FOREIGN PATENT DOCUMENTS

| CN | 1267986 | 9/2000 |
| EP | 1039706 | 9/2000 |

(Continued)

OTHER PUBLICATIONS

Translation of Office Action in Korean application 2006-7004900 corresponding to U.S. Appl. No. 10/801,624, citing US20030012318, KR100810350 and KR100918011 dated Feb. 24, 2011.

(Continued)

*Primary Examiner* — David Oveissi
(74) *Attorney, Agent, or Firm* — Peng Zhu

(57) ABSTRACT

For an incremental redundancy (IR) transmission in a MIMO system, a transmitter processes (e.g., encodes, partitions, interleaves, and modulates) a data packet based on a selected rate to obtain multiple data symbol blocks. The transmitter transmits one data symbol block at a time until a receiver correctly recovers the data packet or all blocks are transmitted. Whenever a data symbol block is received from the transmitter, the receiver detects a received symbol block to obtain a detected symbol block, processes (e.g., demodulates, deinterleaves, re-assembles, and decodes) all detected symbol blocks obtained for the data packet, and provides a decoded packet. If the decoded packet is in error, then the receiver repeats the processing when another data symbol block is received for the data packet. The receiver may also perform iterative detection and decoding on the received symbol blocks for the data packet multiple times to obtain the decoded packet.

44 Claims, 13 Drawing Sheets

(51) Int. Cl.
*H04L 1/00* (2006.01)
*H03M 13/33* (2006.01)
*H04L 5/00* (2006.01)
*H04L 1/16* (2006.01)
*H04L 1/06* (2006.01)
*H04L 27/26* (2006.01)

(56) References Cited

U.S. PATENT DOCUMENTS

| | | | |
|---|---|---|---|
| 6,308,294 B1 | 10/2001 | Ghosh et al. | |
| 6,731,668 B2* | 5/2004 | Ketchum | 375/130 |
| 6,873,606 B2* | 3/2005 | Agrawal et al. | 370/310 |
| 6,987,819 B2* | 1/2006 | Thomas et al. | 375/342 |
| 7,016,658 B2 | 3/2006 | Kim et al. | |
| 7,020,110 B2 | 3/2006 | Walton et al. | |
| 7,031,371 B1* | 4/2006 | Lakkis | 375/146 |
| 7,031,419 B2* | 4/2006 | Piirainen | 375/358 |
| 7,133,459 B2* | 11/2006 | Onggosanusi et al. | 375/267 |
| 7,155,171 B2* | 12/2006 | Ebert et al. | 455/67.14 |
| 7,184,713 B2 | 2/2007 | Kadous et al. | |
| 7,233,625 B2 | 6/2007 | Ma | |
| 7,366,520 B2* | 4/2008 | Haustein et al. | 455/450 |
| 7,522,526 B2 | 4/2009 | Yi et al. | |
| 2002/0041635 A1 | 4/2002 | Ma et al. | |
| 2002/0159431 A1 | 10/2002 | Moulsley et al. | |
| 2003/0012318 A1 | 1/2003 | Piirainen | |
| 2003/0072285 A1 | 4/2003 | Onggosanusi et al. | |
| 2003/0103584 A1 | 6/2003 | Bjerke et al. | 375/340 |
| 2003/0125040 A1 | 7/2003 | Walton et al. | |
| 2003/0128705 A1 | 7/2003 | Yi et al. | |
| 2003/0185181 A1* | 10/2003 | Balachandran et al. | 370/337 |
| 2004/0057530 A1* | 3/2004 | Tarokh et al. | 375/267 |
| 2004/0081131 A1* | 4/2004 | Walton et al. | 370/344 |
| 2004/0114691 A1* | 6/2004 | Kim | 375/260 |
| 2004/0132496 A1* | 7/2004 | Kim et al. | 455/562.1 |
| 2004/0136349 A1* | 7/2004 | Walton et al. | 370/338 |
| 2004/0184398 A1 | 9/2004 | Walton et al. | 370/203 |
| 2005/0063378 A1 | 3/2005 | Kadous | |
| 2007/0253496 A1* | 11/2007 | Giannakis et al. | 375/260 |

FOREIGN PATENT DOCUMENTS

| | | |
|---|---|---|
| EP | 1069722 A2 | 1/2001 |
| EP | 1213868 A1 | 6/2002 |
| EP | 02087088 | 10/2002 |
| EP | 1009124 B1 | 12/2002 |
| EP | 1294120 | 3/2003 |
| EP | 1294120 A1 | 3/2003 |
| EP | 1309102 A1 | 5/2003 |
| JP | 2002217752 | 8/2002 |
| JP | 200318131 | 1/2003 |
| JP | 2003124915 | 4/2003 |
| JP | 2003134094 | 5/2003 |
| JP | 2004520750 | 7/2004 |
| KR | 100810350 | 3/2008 |
| KR | 100918011 | 9/2009 |
| RU | 2120184 C1 | 10/1998 |
| TW | 200302642 | 8/2003 |
| TW | 200302648 | 8/2003 |
| WO | 9512296 | 5/1995 |
| WO | 02078232 | 10/2002 |
| WO | WO 02082689 A2 | 10/2002 |
| WO | WO02087088 A2 | 10/2002 |
| WO | WO02093784 | 11/2002 |
| WO | WO2005027355 A2 | 3/2005 |

OTHER PUBLICATIONS

Translation of Office Action in Korean application 2010-7013873 corresponding to U.S. Appl. No. 10/801,624, citing US20030012318 and KR100918011 dated Feb. 24, 2011.
Translation of Office Action in Korean application 2010-7013874 corresponding to U.S. Appl. No. 10/801,624, citing US20030012318 and KR100810350 dated Feb. 24, 2011.
European Search Report—EP04783740, European Patent Office, The Hague, Feb. 20, 2008.
International Search Report PCT/US04/029648, International Search Authority—United States, Dec. 2, 2005.
Onggosanusi E N et al: "Hybrid ARQ Transmission and Combining for MIMO Systems" ICC 2003. 2003 IEEE International Conference on Communications. Anchorage, AK, May 11-15, 2003, IEEE International Conference on Communications, New York, NY : IEEE, US, vol. vol. 1 of 5, May 11, 2003, pp. 3205-3209, XP010643038 ISBN: 0-7803-7820-4.
Yongzhong Zou et al: "A Novel HARQ and AMC Scheme Using Space-Time Block Coding and Turbo Codes for Wireless Packet Data Transmission" Communication Technology Proceedings, 2003. ICCT2003. International Conference on Apr. 9-11, 2003 Piscataway, NJ, USA, IEEE, vol. 2, Apr. 9, 2003, pp. 1046-1050, XP010644030 ISBN: 7-5635-0686-1.
Woo Tae Kim et al: "Performance of STBC With:Turbo Code in HARQ Scheme for Mobile Communication Systems" Telecommunications, 2003. ICT 2003. 10th International Conference on Feb. 23-Mar. 1, 2003, Piscataway, NJ, USA, IEEE, Feb. 23, 2003, pp. 85-89, XP010637789 ISBN: 0-7803-7661-7.
El-Gamal .H et., "A new approach to layered space-time coding and signal processing," IEEE Transactions on Information Theory, Sep. 2001.
European Search Report-EP04783748, European Patent Office—The Hague—Feb. 20, 2008.
Foschini G J: "Layered Space-Time Architecture for Wireless Communication in a Fading Environment when using Multi-Element Antennas" Bell Labs Technical Journal, Wiley, CA, US, vol. 1, No. 2, Sep. 21, 1996 (Sep. 21, 2006), pp. 41-59, XP000656005.
International Search Report—PCT/US04/029648, International Search Authority—United States-Dec. 2, 2005.
Onggosanusi E N, et al., "Hybrid ARQ Transmission and Combining for MIMO Systems" ICC 2003. 2003 IEEE International Conference on Communications. Anchorage, AK, May 11-15, 2003, IEEE International Conference on Communications, New York, NY : IEEE, US, vol. 1(5) pp. 3205-3209.
Taiwan Search Report—TW093127311—TIPO—March 17, 2011.
Tarokh et al., "Space-Time Codes for High Data Rate Wireless Communication: Performance Criterion and Code Construction," IEEE Transactions on Information Theory, vol. 44, No. 2, pp. 744-765, Mar. 1998.
Wolniansky, P.W.; Foschini, G.J.; Golden, G.D.; Valenzuela, R.A.; , "V-BLAST: an architecture for realizing very high data rates over the rich-scattering wireless channel," Signals, Systems, and Electronics, 1998. ISSSE 98. 1998 URSI International Symposium, pp. 295-300, (Sep. 29-Oct. 2, 1998), doi: 10.1109/ISSSE.1998.738086.
Woo Tae Kim et al: " Performance of STBC With Turbo Code in Harq Scheme for Mobile Communication Systems" Telecommunications, 2003. ICT 2003. 10th International Conference on Feb. 23-Mar. 1, 2003, Piscataway, NJ, USA, IEEE, Feb. 23, 2003, pp. 85-89.
"Written Opinion—PCT/US2004/029648, International Search Authority, European Patent Office, Dec. 2, 2005".
Yongzhong Zou et al: "A Novel HARQ and AMC Scheme Using Space-Time Block Coding and Turbo Codes for Wireless Packet Data Transmission" Communication Technology Proceedings, 2003. ICCT 2003. International Conference on April 9-11, 2003 Piscataway, NJ, USA.
3GPP TS 25.308 V5.4.0, High Speed Downlink Packet Access (HSPDA) Overall Description; Stage 2 (Release 5), Mar. 2003.
European Search Report—EP08157011, European Patent Office—The Hague—Jul. 11, 2008.
European Search Report—EP09174530—Search Authority—The Hague—Jun. 22, 2012.
Sellathurai M., et al., "Joint beamformer estimation and co-antenna interference cancellation for Turbo-Blast", 2001, IEEE International Conference on Acoustics, Speech, and Signal Processing, Proceedings, (ICASSP), Salt Lake City, UT, May 7-11, 2001; [IEEE International Conference on Acoustics, Speech, and Signal Processing (ICASSP)], New York, NY, IEEE, US, May 7, 2001 (May 7, 2001), pp. 2453-2456, XP010803273 ISBN: 978-0-7803-7041-8.
Supplementary European Search Report—EP04783748—Search Authority—The Hague—Feb. 27, 2008.
Taiwan Search Report—TW099119977—TIPO—Mar. 25, 2013.
Taiwan Search Report—TWO99119979—TIPO—Apr. 9, 2013.

* cited by examiner

FIG. 7A

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| Antenna 1 | $s_1$ | $s_5$ | $s_9$ | $s_{13}$ | $s_{17}$ | $s_{21}$ | $s_{25}$ | $s_{29}$ | $s_{33}$ | $s_{37}$ | $s_{41}$ | $s_{45}$ | $s_{49}$ | $s_{53}$ | $s_{57}$ | $s_{61}$ |
| Antenna 2 | $s_2$ | $s_6$ | $s_{10}$ | $s_{14}$ | $s_{18}$ | $s_{22}$ | $s_{26}$ | $s_{30}$ | $s_{34}$ | $s_{38}$ | $s_{42}$ | $s_{46}$ | $s_{50}$ | $s_{54}$ | $s_{58}$ | $s_{62}$ |
| Antenna 3 | $s_3$ | $s_7$ | $s_{11}$ | $s_{15}$ | $s_{19}$ | $s_{23}$ | $s_{27}$ | $s_{31}$ | $s_{35}$ | $s_{39}$ | $s_{43}$ | $s_{47}$ | $s_{51}$ | $s_{55}$ | $s_{59}$ | $s_{63}$ |
| Antenna 4 | $s_4$ | $s_8$ | $s_{12}$ | $s_{16}$ | $s_{20}$ | $s_{24}$ | $s_{28}$ | $s_{32}$ | $s_{36}$ | $s_{40}$ | $s_{44}$ | $s_{48}$ | $s_{52}$ | $s_{56}$ | $s_{60}$ | $s_{64}$ |

Subbands → Time

FIG. 7B

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| Antenna 1 | $s_{1,1}$ | 0 | $s_{2,3}$ | 0 | $s_{1,5}$ | 0 | $s_{2,7}$ | 0 | $s_{1,9}$ | 0 | $s_{2,11}$ | 0 | $s_{1,13}$ | 0 | $s_{2,15}$ | 0 |
| Antenna 2 | 0 | $s_{1,2}$ | 0 | $s_{2,4}$ | 0 | $s_{1,6}$ | 0 | $s_{2,8}$ | 0 | $s_{1,10}$ | 0 | $s_{2,12}$ | 0 | $s_{1,14}$ | 0 | $s_{2,16}$ |
| Antenna 3 | $s_{2,1}$ | 0 | $s_{1,3}$ | 0 | $s_{2,5}$ | 0 | $s_{1,7}$ | 0 | $s_{2,9}$ | 0 | $s_{1,11}$ | 0 | $s_{2,13}$ | 0 | $s_{1,15}$ | 0 |
| Antenna 4 | 0 | $s_{2,2}$ | 0 | $s_{1,4}$ | 0 | $s_{2,6}$ | 0 | $s_{1,8}$ | 0 | $s_{2,10}$ | 0 | $s_{1,12}$ | 0 | $s_{2,14}$ | 0 | $s_{1,16}$ |

Subbands → Time

INCREMENTAL REDUNDANCY TRANSMISSION IN A MIMO COMMUNICATION SYSTEM

CROSS-REFERENCE TO RELATED APPLICATION

This application claims priority to U.S. Provisional Patent Application Ser. No. 60/501,777, filed Sep. 9, 2003, and U.S. Provisional Patent Application Ser. No. 60/531,391 filed Dec. 18, 2003, which are incorporated herein by reference in their entirety.

BACKGROUND

I. Field

The present invention relates generally to communication, and more specifically to techniques for transmitting data in a multiple-input multiple-output (MIMO) communication system.

II. Background

A MIMO system employs multiple ($N_T$) transmit antennas and multiple ($N_R$) receive antennas for data transmission and is denoted as an ($N_T$, $N_R$) system. A MIMO channel formed by the $N_T$ transmit and $N_R$ receive antennas may be decomposed into $N_S$ spatial channels, where $N_S \leq \min \{N_T, N_R\}$. The MIMO system can provide increased transmission capacity if the $N_S$ spatial channels created by the multiple transmit and receive antennas are used for data transmission.

A major challenge in a MIMO system is selecting a suitable rate for data transmission based on channel conditions. A "rate" may indicate a particular data rate or information bit rate, a particular coding scheme, a particular modulation scheme, a particular data packet size, and so on. The goal of the rate selection is to maximize throughput on the $N_S$ spatial channels while meeting certain quality objectives, which may be quantified by a particular packet error rate (e.g., 1% PER).

The transmission capacity of a MIMO channel is dependent on the signal-to-noise-and-interference ratios (SNRs) achieved by the $N_S$ spatial channels. The SNRs are in turn dependent on the channel conditions. In one conventional MIMO system, a transmitter encodes, modulates, and transmits data in accordance with a rate that is selected based on a model of a static MIMO channel. Good performance can be achieved if the model is accurate and if the MIMO channel is relatively static (i.e., does not change over time). In another conventional MIMO system, a receiver estimates the MIMO channel, selects a suitable rate based on the channel estimates, and sends the selected rate to the transmitter. The transmitter then processes and transmits data in accordance with the selected rate. The performance of this system is dependent on the nature of the MIMO channel and the accuracy of the channel estimates.

For both conventional MIMO systems described above, the transmitter typically processes and transmits each data packet at the rate selected for that data packet. The receiver decodes each data packet transmitted by the transmitter and determines whether the packet is decoded correctly or in error. The receiver may send back an acknowledgment (ACK) if the packet is decoded correctly or a negative acknowledgment (NAK) if the packet is decoded in error. The transmitter may retransmit each data packet decoded in error by the receiver, in its entirety, upon receiving a NAK from the receiver for the packet.

The performance of both MIMO systems described above is highly dependent on the accuracy of the rate selection. If the selected rate for a data packet is too conservative (e.g., because the actual SNR is much better than the SNR estimate), then excessive system resources are expended to transmit the data packet and channel capacity is underutilized. Conversely, if the selected rate for the data packet is too aggressive, then the packet may be decoded in error by the receiver and system resources may be expended to retransmit the data packet. Rate selection for a MIMO system is challenging because of (1) greater complexity in the channel estimation for a MIMO channel and (2) the time-varying and independent nature of the multiple spatial channels of the MIMO channel.

There is therefore a need in the art for techniques to efficiently transmit data in a MIMO system and which do not require accurate rate selection in order to achieve good performance.

SUMMARY

Techniques are provided herein for performing incremental redundancy (IR) transmission in a MIMO system. Initially, a receiver or a transmitter in the MIMO system estimates a MIMO channel and selects a suitable rate for data transmission on the MIMO channel. The transmitter is provided with the selected rate if the receiver performs the rate selection.

The transmitter processes (e.g., encodes, partitions, interleaves, and modulates) a data packet based on the selected rate and obtains multiple ($N_B$) data symbol blocks for the data packet. The first data symbol block typically contains sufficient information to allow the receiver to recover the data packet under favorable channel conditions. Each of the remaining data symbol blocks contains additional redundancy to allow the receiver to recover the data packet under less favorable channel conditions. The transmitter transmits the first data symbol block from $N_T$ transmit antennas to $N_R$ receive antennas at the receiver. The transmitter thereafter transmits remaining ones of the $N_B$ data symbol blocks, one block at a time, until the data packet is recovered correctly by the receiver or all of the $N_B$ blocks are transmitted.

If multiple ($N_P$) data symbol blocks for $N_P$ data packets are to be transmitted simultaneously from the $N_T$ transmit antennas, then the transmitter further processes these $N_P$ data symbol blocks such that the $N_P$ data packets experience similar channel conditions. This allows a single rate to be used for all data packets transmitted simultaneously over the MIMO channel.

The receiver obtains a received symbol block for each data symbol block transmitted by the transmitter. The receiver "detects" each received symbol block to obtain a detected symbol block, which is an estimate of the corresponding data symbol block. The receiver then processes (e.g., demodulates, deinterleaves, re-assembles, and decodes) all detected symbol blocks obtained for the data packet and provides a decoded packet. The receiver may send back an ACK if the decoded packet is correctly decoded and a NAK if the decoded packet is in error. If the decoded packet is in error, then the receiver repeats the processing when another received symbol block is obtained for another data symbol block transmitted by the transmitter.

The receiver may also recover the data packet using an iterative detection and decoding (IDD) scheme. For the IDD scheme, whenever a new received symbol block is obtained for the data packet, detection and decoding are iteratively performed multiple ($N_{dd}$) times on all received symbol blocks to obtain the decoded packet. A detector performs detection on all received symbol blocks and provides detected symbol blocks. A decoder performs decoding on all detected symbol blocks and provides decoder a priori information, which is used by the detector in a subsequent iteration. The decoded packet is generated based on decoder output for the last iteration.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout and wherein:

FIGS. 7A and 7B show the demultiplexing of one data symbol block and two data symbol blocks, respectively, for an exemplary MIMO-OFDM system;

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

For a MIMO system with $N_S$ spatial channels, $N_P$ data packets may be transmitted simultaneously from the $N_T$ transmit antennas, where $1 \leq N_P \leq N_S$. A single rate may be used for all data packets transmitted simultaneously, regardless of the value for $N_P$. The use of a single rate can simplify the processing at both the transmitter and the receiver in the MIMO system.

Figure 1:
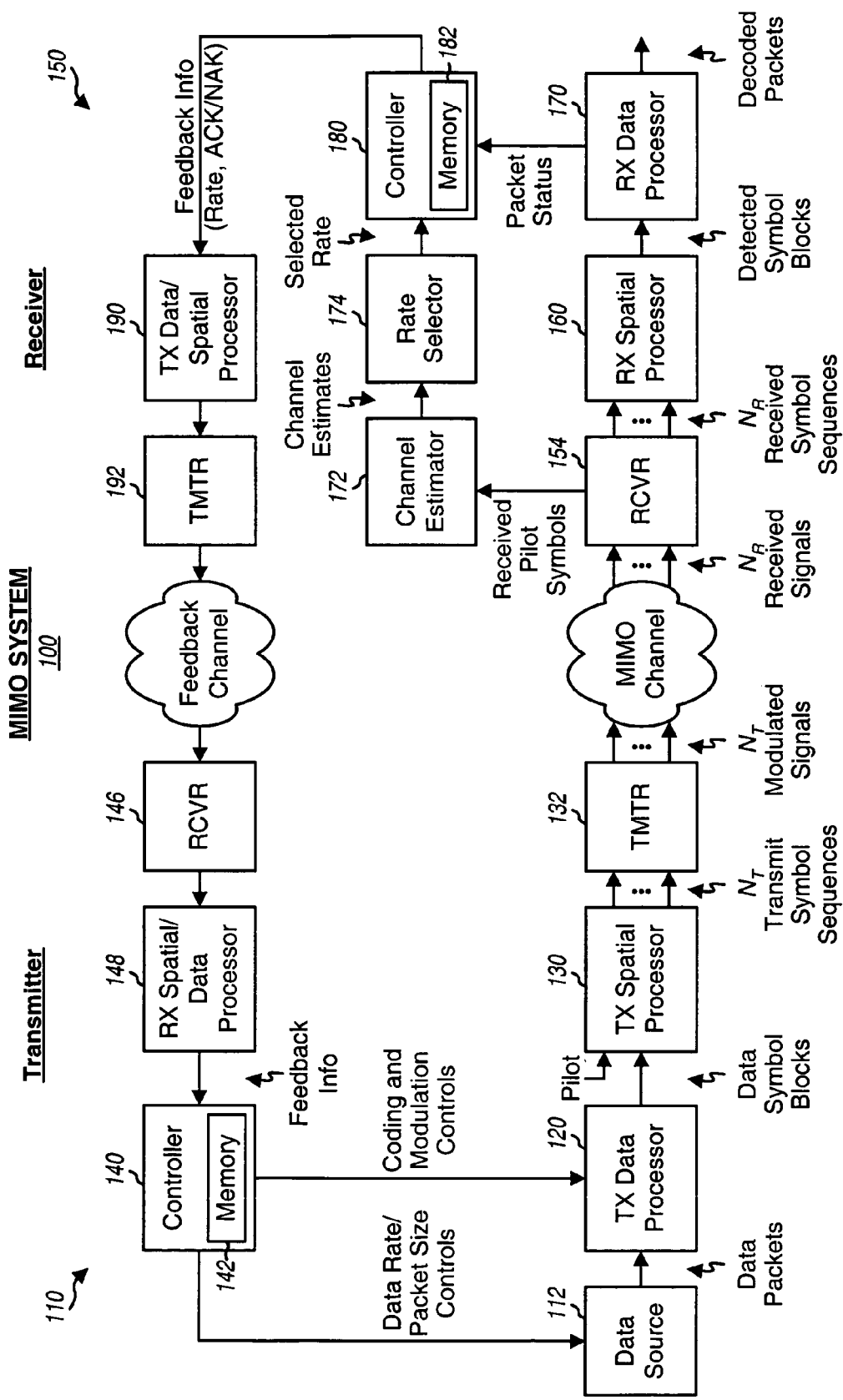
FIG. 1 shows a block diagram of a transmitter and a receiver in a MIMO system that implements IR transmission.

FIG. 1 shows a block diagram of a transmitter 110 and a receiver 150 in a MIMO system 100 that implements IR transmission. At transmitter 110, a TX data processor 120 receives data packets from a data source 112. TX data processor 120 processes (e.g., formats, encodes, partitions, interleaves, and modulates) each data packet in accordance with a rate selected for that packet to obtain $N_B$ blocks of data symbols for the packet, where $N_B > 1$ and may be dependent on the selected rate. The selected rate for each data packet may indicate the data rate, coding scheme or code rate, modulation scheme, packet size, number of data symbol blocks, and so on, for that packet, which are indicated by the various controls provided by a controller 140. For IR transmission, the $N_B$ data symbol blocks for each data packet are transmitted one block at a time until the packet is decoded correctly by receiver 150 or all $N_B$ data symbol blocks have been transmitted.

A TX spatial processor 130 receives the data symbol blocks and performs the necessary processing to transmit each data symbol block from all $N_T$ transmit antennas in one time slot (or simply, "slot"). A slot is a predetermined time period for MIMO system 100. TX spatial processor 130 may perform demultiplexing, spatial processing, and so on, as described below. For each slot, TX spatial processor 130 processes one data symbol block, multiplexes in pilot symbols as appropriate, and provides $N_T$ sequences of transmit symbols to a transmitter unit (TMTR) 132. Each transmit symbol may be for a data symbol or a pilot symbol.

Transmitter unit 132 receives and conditions (e.g., converts to analog, frequency upconverts, filters, and amplifies) the $N_T$ transmit symbol sequences to obtain $N_T$ modulated signals. Each modulated signal is then transmitted from a respective transmit antenna (not shown in FIG. 1) and via the MIMO channel to receiver 150. The MIMO channel distorts the $N_T$ transmitted signals with a channel response of Hand further degrades the transmitted signals with additive white Gaussian noise and possibly interference from other transmitters.

At receiver 150, the $N_T$ transmitted signals are received by each of $N_R$ receive antennas (not shown in FIG. 1), and the $N_R$ received signals from the $N_R$ receive antennas are provided to a receiver unit (RCVR) 154. Receiver unit 154 conditions, digitizes, and pre-processes each receive signal to obtain a sequence of received symbols for each slot. Receiver unit 154 provides $N_R$ received symbol sequences (for data) to an RX spatial processor 160 and received pilot symbols (for pilot) to a channel estimator 172. RX spatial processor 160 processes (e.g., detects and multiplexes) the $N_R$ received symbol sequences for each slot to obtain a detected symbol block, which is an estimate of the data symbol block sent by transmitter 110 for that slot.

An RX data processor 170 receives all detected symbol blocks that have been received for the data packet being recovered (i.e., the "current" packet), processes (e.g., demodulates, deinterleaves, re-assembles, and decodes) these detected symbol blocks in accordance with the selected rate, and provides a decoded packet, which is an estimate of the data packet sent by transmitter 110. RX data processor 170 also provides the status of the decoded packet, which indicates whether the packet is decoded correctly or in error.

Channel estimator 172 processes the received pilot symbols and/or received data symbols to obtain channel estimates (e.g., channel gain estimates and SNR estimates) for the MIMO channel. A rate selector 174 receives the channel estimates and selects a rate for the next data packet to be transmitted to receiver 150. A controller 180 receives the selected rate from rate selector 174 and the packet status from RX data processor 170 and assembles feedback information for transmitter 110. The feedback information may include the selected rate for the next packet, an ACK or a NAK for the current packet, and so on. The feedback information is processed by a TX data/spatial processor 190, further conditioned by a transmitter unit 192, and transmitted via a feedback channel to transmitter 110.

At transmitter 110, the signal(s) transmitted by receiver 150 are received and conditioned by a receiver unit 146 and further processed by an RX spatial/data processor 148 to recover the feedback information sent by receiver 150. Controller 140 receives the recovered feedback information, uses the selected rate to process the next data packet to be sent to receiver 150, and uses the ACK/NAK to control the IR transmission of the current packet.

Controllers 140 and 180 direct the operation at transmitter 110 and receiver 150, respectively. Memory units 142 and 182 provide storage for program codes and data used by controllers 140 and 180, respectively. Memory units 142 and 182 may be internal to controllers 140 and 180, as shown in FIG. 1, or external to these controllers. The processing units shown in FIG. 1 are described in detail below.

Figure 2:
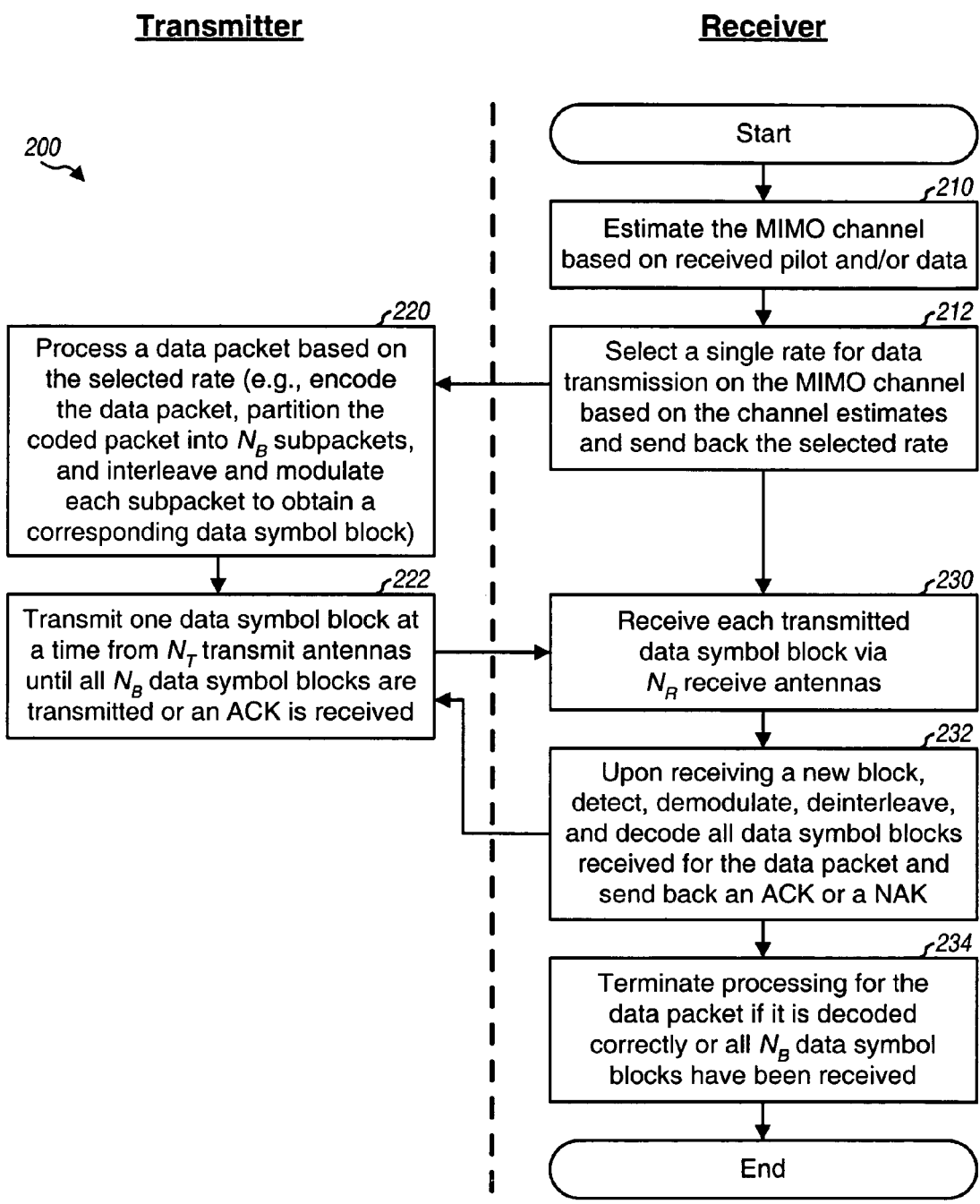
FIG. 2 shows a process for sending and receiving an IR transmission in the MIMO system.

FIG. 2 shows a flow diagram of a process 200 for sending and receiving an IR transmission in the MIMO system. Initially, the receiver estimates the MIMO channel based on pilot and/or data symbols received from the transmitter (step 210). The receiver selects a single rate for data transmission on the MIMO channel based on the channel estimates and sends the selected rate to the transmitter (step 212). The transmitter receives the selected rate and encodes a data packet in accordance with the selected rate to obtain a coded packet (step 220). The transmitter then partitions the coded packet into $N_B$ subpackets, where $N_B$ may also be determined by the selected rate, and further processes each subpacket to obtain a corresponding data symbol block (also in step 220). The transmitter transmits one data symbol block at a time from the $N_T$ transmit antennas until all $N_B$ data symbol blocks are transmitted or an ACK is received from the receiver for the data packet (step 222).

The receiver receives each transmitted data symbol block via the $N_R$ receive antennas (step 230). Whenever a new data symbol block is received, the receiver detects and decodes all data symbol blocks that have been received for the data packet (step 232). The receiver also checks the decoded packet to determine whether the packet is decoded correctly (good) or in error (erased) (also step 232). If the decoded packet is erased, then the receiver can send a NAK back to the transmitter, which uses this feedback to initiate transmission of the next data symbol block for the data packet. Alternatively, the transmitter can send one data symbol block at a time until an ACK is received from the receiver, which may or may not send back NAKs. The receiver terminates the processing for the data packet if the packet is decoded correctly or if all $N_B$ data symbol blocks have been received for the packet (step 234).

FIG. 2 shows a specific embodiment for IR transmission in a MIMO system. IR transmission may also be implemented in other manners, and this is within the scope of the invention. IR transmission may be implemented in both frequency division duplex (FDD) and time division duplex (TDD) systems. For an FDD system, the forward MIMO channel and the feedback channel use different frequency bands and are likely to observe different channel conditions. In this case, the receiver can estimate the forward MIMO channel and send back the selected rate, as shown in FIG. 2. For a TDD system, the forward MIMO channel and the feedback channel share the same frequency band and are likely to observe similar channel conditions. In this case, the transmitter can estimate the MIMO channel based on a pilot sent by the receiver and use this channel estimate to select the rate for data transmission to the receiver. The channel estimation and rate selection may be performed by the receiver, the transmitter, or both.

Figure 3:
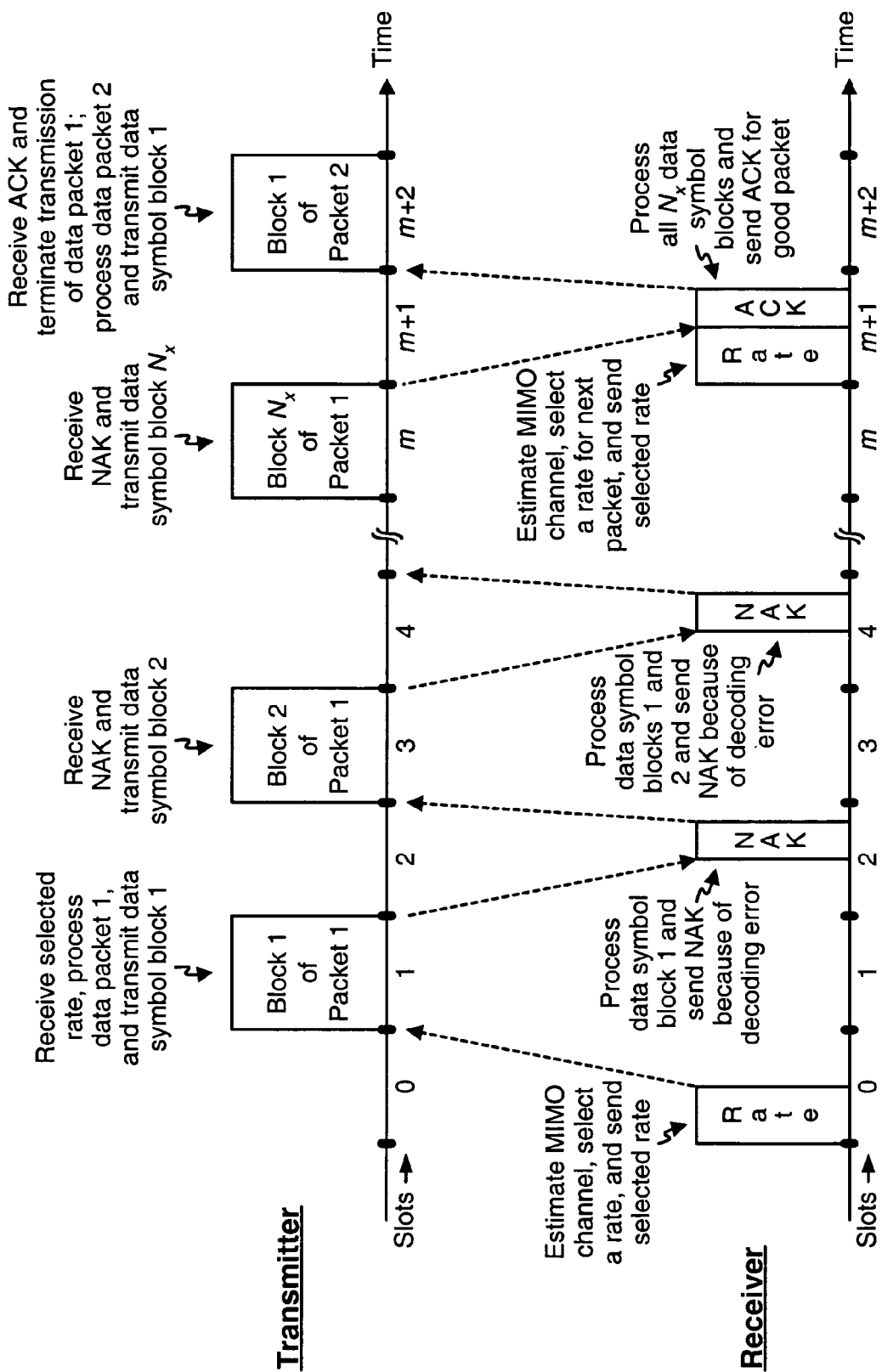
FIG. 3 shows a timing diagram that illustrates the IR transmission.

FIG. 3 illustrates IR transmission in the MIMO system. The receiver estimates the MIMO channel, selects a rate $r_1$, and sends the selected rate to the transmitter in slot 0. The transmitter receives the selected rate from the receiver, processes a data packet (Packet 1) in accordance with the selected rate, and transmits the first data symbol block (Block 1) for the data packet in slot 1. The receiver receives, detects, and decodes the first data symbol block, determines that Packet 1 is decoded in error, and sends back a NAK in slot 2. The transmitter receives the NAK and transmits the second data symbol block (Block 2) for Packet 1 in slot 3. The receiver receives Block 2, detects and decodes the first two data symbol blocks, determines that Packet 1 is still decoded in error, and sends back a NAK in slot 4. The block transmission and NAK response may repeat any number of times. In the example shown in FIG. 3, the transmitter receives a NAK for data symbol block $N_x-1$ and transmits data symbol block $N_x$ for Packet 1 in slot m, where $N_x$ is less than or equal to the total number of blocks for Packet 1. The receiver receives, detects, and decodes all $N_x$ data symbol blocks received for Packet 1, determines that the packet is decoded correctly, and sends back an ACK in slot m+1. The receiver also estimates the MIMO channel, selects a rate $r_2$ for the next data packet, and sends the selected rate to the transmitter in slot m+1. The transmitter receives the ACK for data symbol block $N_x$ and terminates the transmission of Packet 1. The transmitter also processes the next data packet (Packet 2) in accordance with the selected rate, and transmits the first data symbol block (Block 1) for Packet 2 in slot m+2. The processing at the transmitter and receiver continues in the same manner for each data packet transmitted via the MIMO channel.

For the embodiment shown in FIG. 3, there is a delay of one slot for the ACK/NAK response from the receiver for each block transmission. To improve channel utilization, multiple data packets may be transmitted in an interlaced manner. For example, data packets for one traffic channel may be transmitted in odd-numbered slots and data packets for another traffic channel may be transmitted in even-numbered slots. More than two traffic channels may also be interlaced if the ACK/NAK delay is longer than one slot.

1. Transmitter

Figure 4A:
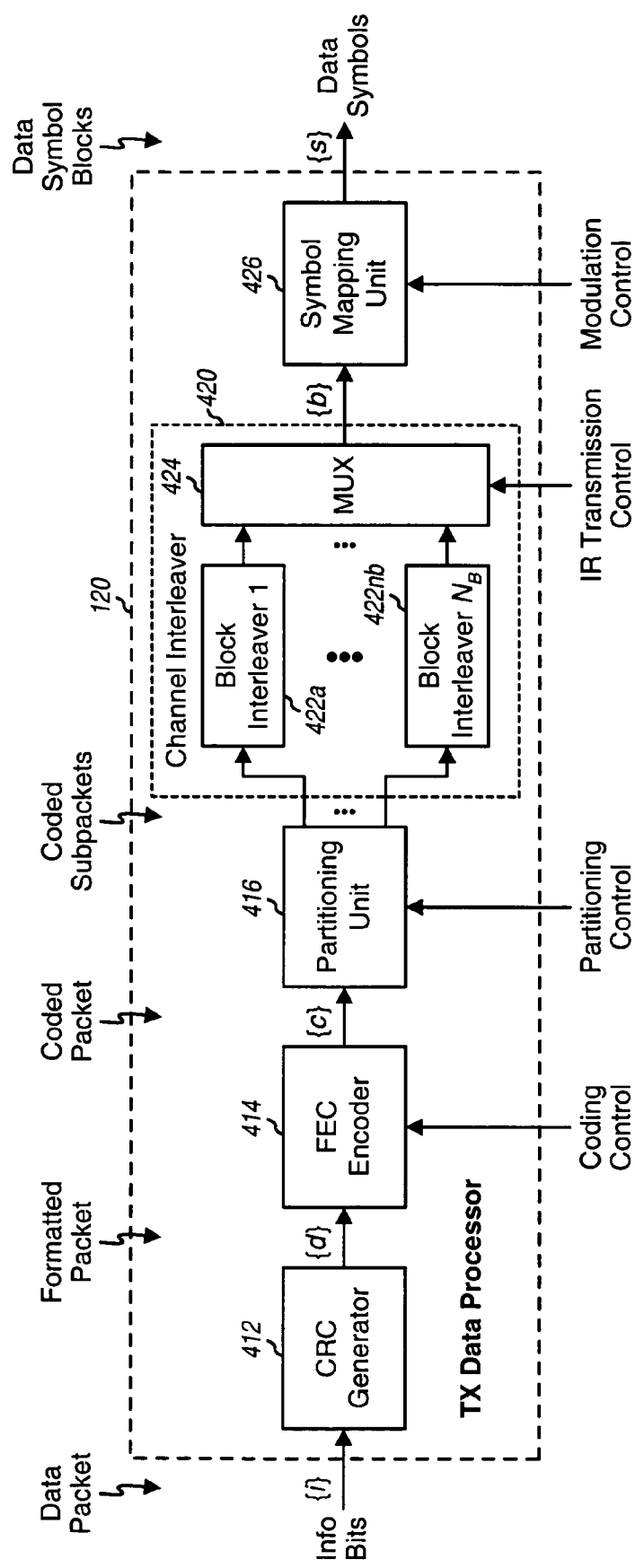
FIG. 4A shows a transmit (TX) data processor at the transmitter.
Figure 5:
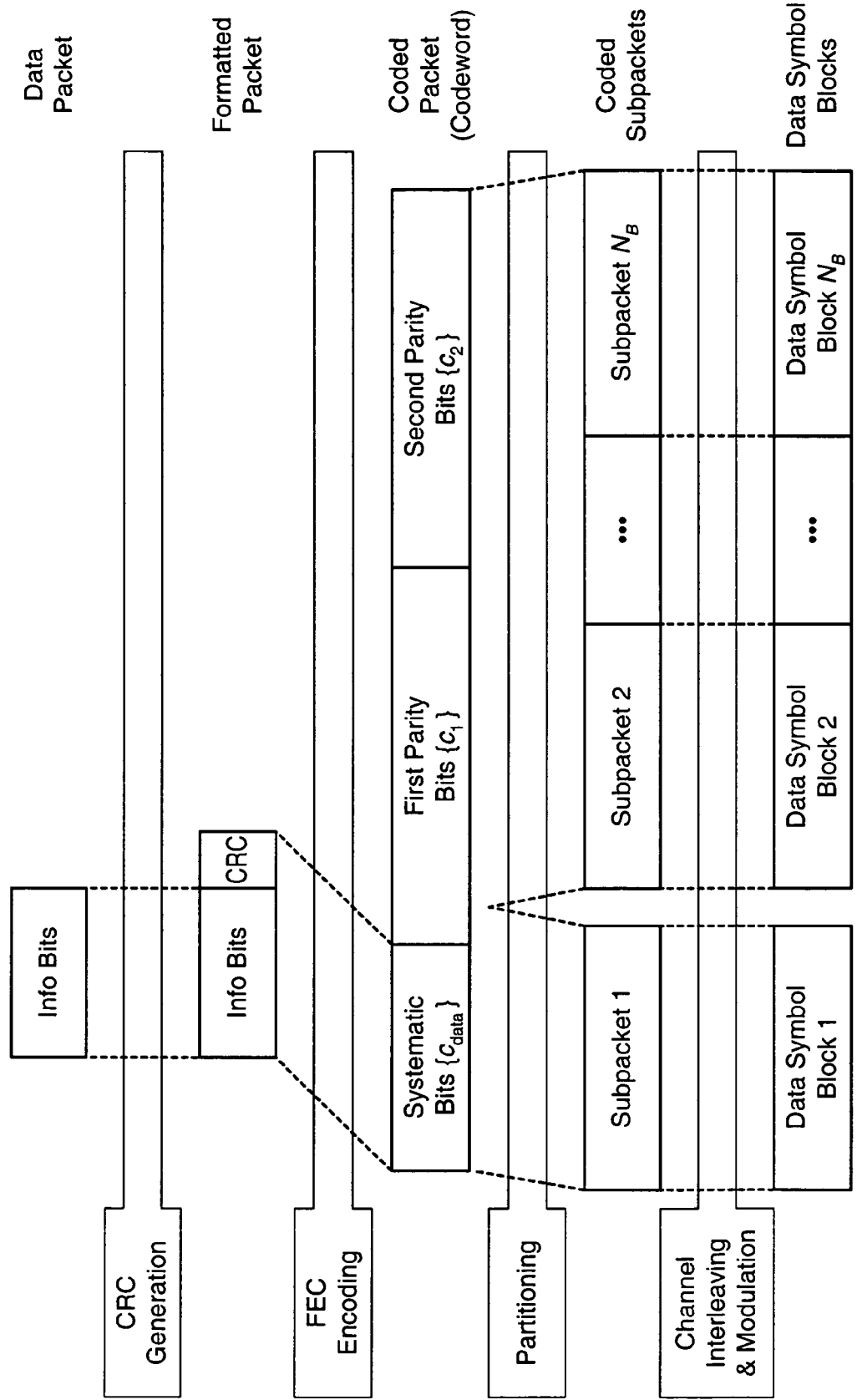
FIG. 5 illustrates the processing of one data packet by the TX data processor.

FIG. 4A shows a block diagram of an embodiment of TX data processor 120 within transmitter 110. TX data processor 120 receives data packets, processes each packet based on its selected rate, and provides $N_B$ data symbol blocks for the packet. FIG. 5 illustrates the processing of one data packet by TX data processor 120.

Within TX data processor 120, a cyclic redundancy check (CRC) generator 412 receives a data packet, generates a CRC value for the data packet, and appends the CRC value to the end of the data packet to form a formatted packet. The CRC value is used by the receiver to check whether the packet is decoded correctly or in error. Other error detection codes may also be used instead of CRC. A forward error correction (FEC) encoder 414 then encodes the formatted packet in accordance with a coding scheme or code rate indicated by the selected rate and provides a coded packet or "codeword". The encoding increases the reliability of the data transmission. FEC encoder 414 may implement a block code, a convolutional code, a Turbo code, some other code, or a combination thereof.

Figure 4B:
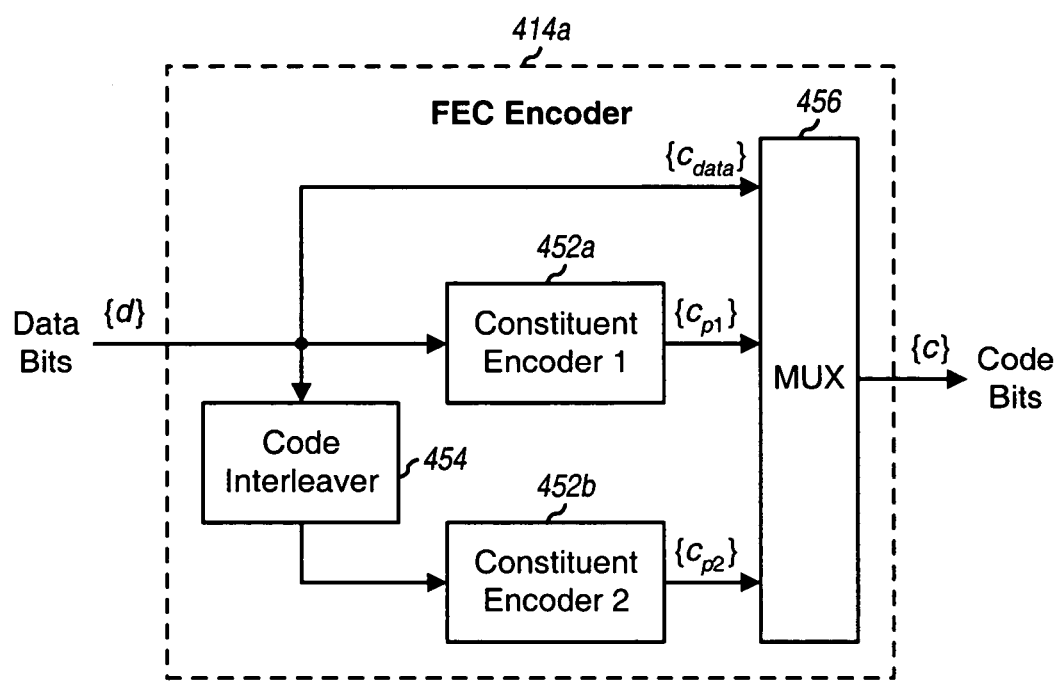
FIG. 4B shows a Turbo encoder within the TX data processor.

FIG. 4B shows a block diagram of a parallel concatenated convolutional encoder (or Turbo encoder) 414a, which may be used for FEC encoder 414 in FIG. 4A. Turbo encoder 414a includes two constituent convolutional encoders 452a and 452b, a code interleaver 454, and a multiplexer (MUX) 456. Code interleaver 454 interleaves the data bits in the formatted packet (denoted as $\{d\}$) in accordance with a code interleaving scheme. Constituent encoder 452a receives and encodes the data bits with a first constituent code and provides first parity bits (denoted as $\{c_{p1}\}$). Similarly, constituent encoder 452b receives and encodes the interleaved data bits from code interleaver 454 with a second constituent code and provides second parity bits (denoted as $\{c_{p2}\}$). Constituent encoders 452a and 452b may implement two recursive systematic constituent codes with code rates of $R_1$ and $R_2$, respectively, where $R_1$ may or may not be equal to $R_2$. Multiplexer 456 receives and multiplexes the data bits and the parity bits from constituent encoders 452a and 452b and provides the coded packet of code bits (denoted as $\{c\}$). The coded packet includes the data bits {d}, which are also referred to as systematic bits and denoted as $\{c_{data}\}$, followed by the first parity bits $\{c_{p1}\}$, and then followed by the second parity bits $\{c_{p2}\}$.

Referring back to FIG. 4A, a partitioning unit 416 receives and partitions the coded packet into $N_B$ coded subpackets, where $N_B$ may be dependent on the selected rate and indicated by a partitioning control from controller 140. The first coded subpacket typically contains all of the systematic bits and zero or more parity bits. This allows the receiver to recover the data packet with just the first coded subpacket under favorable channel conditions. The other $N_B-1$ coded subpackets contain the remaining first and second parity bits. Each of these $N_B-1$ coded subpackets typically contains some first parity bits and some second parity bits, with the parity bits being taken across the entire data packet. For example, if $N_B=8$ and the remaining first and second parity bits are given indices starting with 0, then the second coded subpacket may contain bits 0, 7, 14, . . . of the remaining first and second parity bits, the third coded subpacket may contain bits 1, 8, 15, . . . of the remaining first and second parity bits, and so on, and the eighth and last coded subpacket may contain bits 6, 13, 20, . . . of the remaining first and second parity bits. Improved decoding performance may be achieved by spreading the parity bits across the other $N_B-1$ coded subpackets.

A channel interleaver 420 includes $N_B$ block interleavers 422a through 422nb that receive the $N_B$ coded subpackets from partitioning unit 416. Each block interleaver 422 interleaves (i.e., reorders) the code bits for its subpacket in accordance with an interleaving scheme and provides an interleaved subpacket. The interleaving provides time, frequency, and/or spatial diversity for the code bits. A multiplexer 424 couples to all $N_B$ block interleavers 422a through 422nb and provides the $N_B$ interleaved subpackets, one subpacket at a time and if directed an IR transmission control from controller 140. In particular, multiplexer 424 provides the interleaved subpacket from block interleaver 422a first, then the interleaved subpacket from block interleaver 422b next, and so on, and the interleaved subpacket from block interleaver 422nb last. Multiplexer 424 provides the next interleaved subpacket if a NAK is received for the data packet. All $N_B$ block interleavers 422a through 422nb can be purged whenever an ACK is received.

A symbol mapping unit 426 receives the interleaved subpackets from channel interleaver 420 and maps the interleaved data in each subpacket to modulation symbols. The symbol mapping is performed in accordance with a modulation scheme indicated by the selected rate. The symbol mapping may be achieved by (1) grouping sets of B bits to form B-bit binary values, where B≥1, and (2) mapping each B-bit binary value to a point in a signal constellation having $2^B$ points. This signal constellation corresponds to the selected modulation scheme, which may be BPSK, QPSK, $2^B$-PSK, $2^B$-QAM, and so on. As used herein, a "data symbol" is a modulation symbol for data, and a "pilot symbol" is a modulation symbol for pilot. Symbol mapping unit 426 provides a block of data symbols for each coded subpacket, as shown in FIG. 5.

For each data packet, TX data processor 120 provides $N_B$ data symbol blocks, which collectively include $N_{SYM}$ data symbols and can be denoted as $\{s\}=[s_1\ s_2\ \ldots\ s_{N_{SYM}}]$. Each data symbol $s_i$, where $i=1\ldots N_{SYM}$, is obtained by mapping B code bits as follows: $s_i=\text{map}(b_i)$ where $b_i=[b_{i,1}\ b_{i,2}\ \ldots\ b_{i,B}]$.

The IR transmission techniques described herein may be implemented in a single-carrier MIMO system that utilizes one carrier for data transmission and a multi-carrier MIMO system that utilizes multiple carriers for data transmission. Multiple carriers may be provided by orthogonal frequency division multiplexing (OFDM), other multi-carrier modulation techniques, or some other constructs. OFDM effectively partitions the overall system bandwidth into multiple ($N_F$) orthogonal subbands, which are also commonly referred to as tones, bins, or frequency channels. With OFDM, each subband is associated with a respective carrier that may be modulated with data.

The processing performed by TX spatial processor 130 and transmitter unit 132 within transmitter 110 is dependent on whether one or multiple data packets are transmitted simultaneously and whether one or multiple carriers are used for data transmission. Some exemplary designs for these two units are described below. For simplicity, the following description assumes a full rank MIMO channel with $N_S=N_T\leq N_R$. In this case, one modulation symbol may be transmitted from each of the $N_T$ transmit antennas for each subband in each symbol period.

Figure 6A:
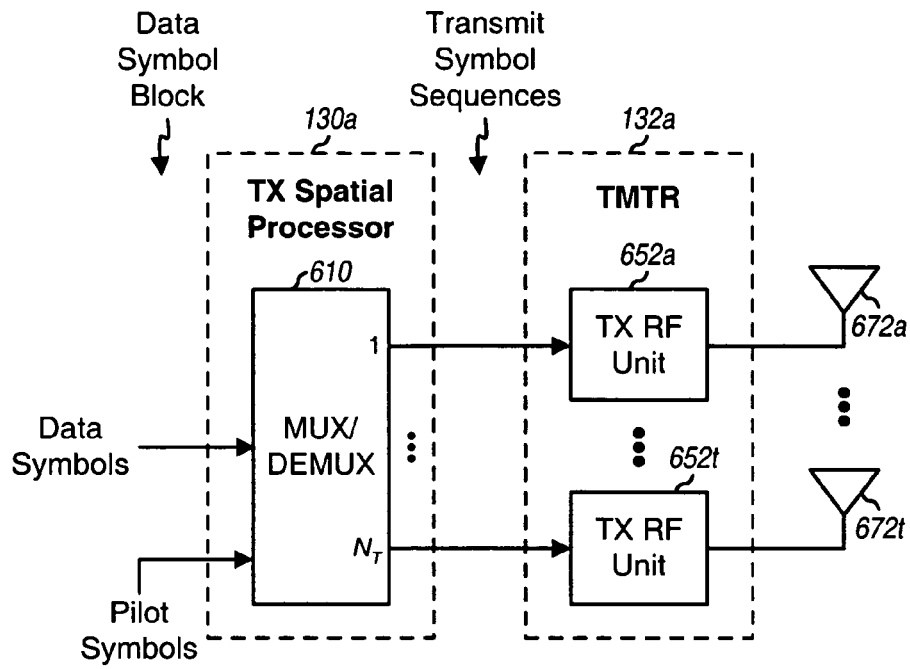
FIGS. 6A through 6D show four embodiments of a TX spatial processor at the transmitter.

FIG. 6A shows a block diagram of a TX spatial processor 130a and a transmitter unit 132a, which may be used for IR transmission of one packet at a time in a single-carrier MIMO system. TX spatial processor 130a includes a multiplexer/demultiplexer (MUX/DEMUX) 610 that receives a data symbol block and demultiplexes the data symbols in the block into $N_T$ subblocks for the $N_T$ transmit antennas. Multiplexer/demultiplexer 610 also multiplexes in pilot symbols (e.g., in a time division multiplex (TDM) manner) and provides $N_T$ transmit symbol sequences for the $N_T$ transmit antennas. Each transmit symbol sequence is designated for transmission from one transmit antenna in one slot. Each transmit symbol may be for a data symbol or a pilot symbol.

Transmitter unit 132a includes $N_T$ TX RF units 652a through 652t for the $N_T$ transmit antennas. Each TX RF unit 652 receives and conditions a respective transmit symbol sequence from TX spatial processor 130a to generate a modulated signal. $N_T$ modulated signals from TX RF units 652a through 652t are transmitted from $N_T$ transmit antennas 672a through 672t, respectively.

Figure 6B:
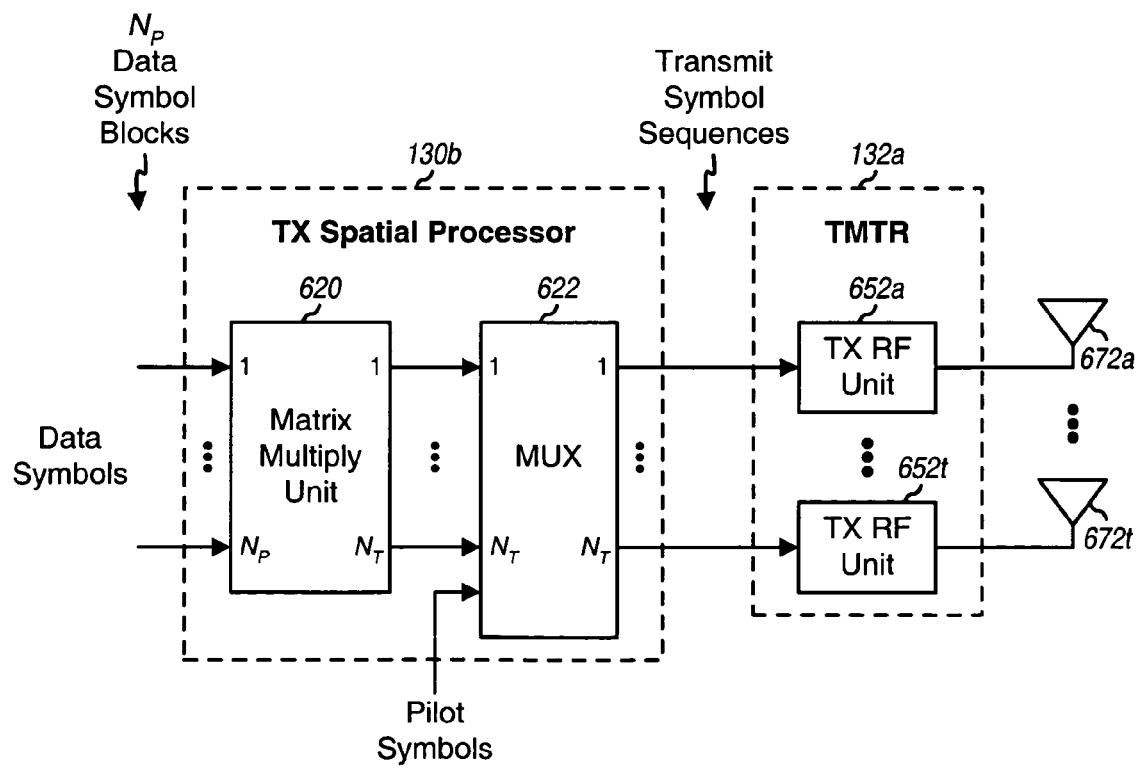

FIG. 6B shows a block diagram of a TX spatial processor 130b and transmitter unit 132a, which may be used for IR transmission of multiple packets simultaneously in a single-carrier MIMO system. TX spatial processor 130b includes a matrix multiplication unit 620 that receives $N_P$ data symbol blocks for transmission in one slot, where $1\leq N_P\leq N_S$. Unit 620 performs matrix multiplication of the data symbols in the $N_P$ blocks with a transmit basis matrix and a diagonal matrix as follows:

$$\tilde{s}=M\Lambda s, \qquad \text{Eq (1)}$$

where s is an $\{N_T\times 1\}$ data vector;
$\tilde{s}$ is an $\{N_T\times 1\}$ preconditioned data vector;
M is an $\{N_T\times N_T\}$ transmit basis matrix, which is a unitary matrix; and
$\Lambda$ is an $\{N_T\times N_T\}$ diagonal matrix.

The vector s includes $N_T$ entries for the $N_T$ transmit antennas, with $N_P$ entries being set to $N_P$ data symbols from the $N_P$ blocks and the remaining $N_T-N_P$ entries being set to zero. The vector $\tilde{s}$ includes $N_T$ entries for $N_T$ preconditioned symbols to be sent from the $N_T$ transmit antennas in one symbol period. The transmit basis matrix M allows each data symbol block to be sent from all $N_T$ transmit antennas. This enables all $N_P$ data symbol blocks to experience similar channel conditions and further allows a single rate to be used for all $N_P$ data packets. The matrix M also allows the full power $P_{ant}$ of each transmit antenna to be utilized for data transmission. The matrix M may be defined as $$M = \frac{1}{\sqrt{N_T}} U,$$

where U is a Walsh-Hadamard matrix. The matrix M may also be defined as $$M = \frac{1}{\sqrt{N_T}} V,$$

where V is a discrete Fourier transform (DFT) matrix with the (k,i)-th entry defined as $$v_{m,n} = e^{-j2\pi \frac{(m-1)(n-1)}{N_T}},$$

where m is a row index and n is a column index for the matrix V, with m=1 ... $N_T$ and n=1 ... $N_T$. The diagonal matrix $\Lambda$ may be used to allocate different transmit powers to the $N_P$ data symbol blocks while conforming to the total transmit power constraint of $P_{tot}$ for each transmit antenna. The "effective" channel response observed by the receiver is then $H_{eff}$=HM. This transmission scheme is described in further detail in commonly assigned U.S. patent application Ser. No. 10/367,234, entitled "Rate Adaptive Transmission Scheme for MIMO Systems," filed Feb. 14, 2003.

A multiplexer 622 receives the preconditioned symbols from matrix multiplication unit 620, multiplexes in pilot symbols, and provides $N_T$ transmit symbol sequences for the $N_T$ transmit antennas. Transmitter unit 132a receives and conditions the $N_T$ transmit symbol sequences and generates $N_T$ modulated signals.

Figure 6C:
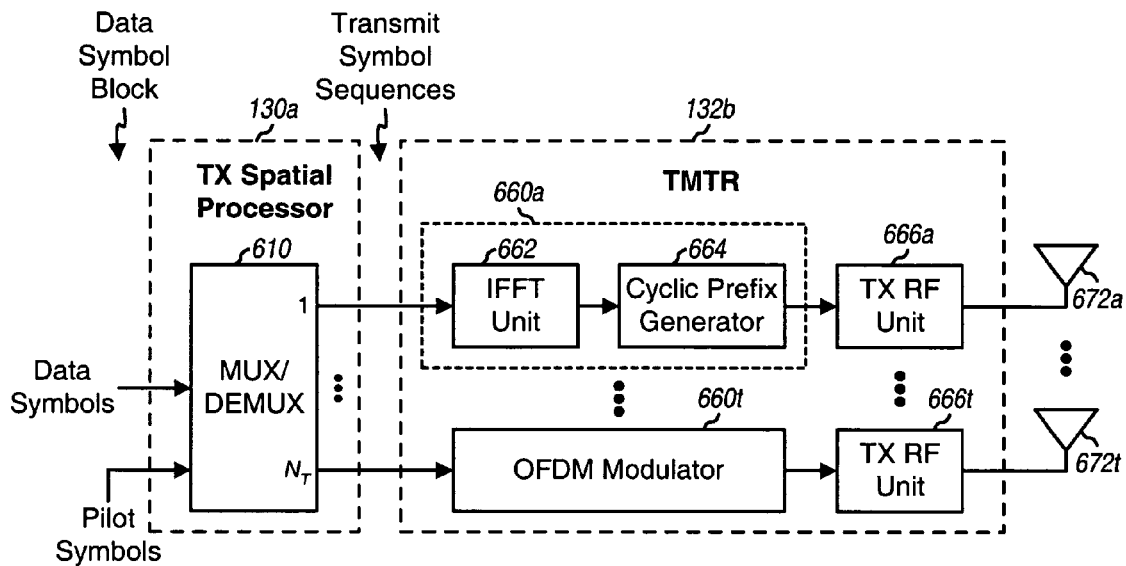

FIG. 6C shows a block diagram of TX spatial processor 130a and a transmitter unit 132b, which may be used for IR transmission of one packet at a time in a MIMO-OFDM system. Within TX spatial processor 130a, multiplexer/demultiplexer 610 receives and demultiplexes the data symbols, multiplexes in pilot symbols, and provides $N_T$ transmit symbol sequences for the $N_T$ transmit antennas.

Transmitter unit 132b includes $N_T$ OFDM modulators 660a through 660t and $N_T$ TX RF units 666a through 666t for the $N_T$ transmit antennas. Each OFDM modulator 660 includes an inverse fast Fourier transform (IFFT) unit 662 and a cyclic prefix generator 664. Each OFDM modulator 660 receives a respective transmit symbol sequence from TX spatial processor 130a and groups each set of $N_F$ transmit symbols and zero signal values for the $N_F$ subbands. (Subbands not used for data transmission are filled with zeros.) IFFT unit 662 transforms each set of $N_F$ transmit symbols and zeros to the time domain using an $N_F$-point inverse fast Fourier transform and provides a corresponding transformed symbol that contains $N_F$ chips. Cyclic prefix generator 664 repeats a portion of each transformed symbol to obtain a corresponding OFDM symbol that contains $N_F+N_{cp}$ chips. The repeated portion is referred to as a cyclic prefix, and $N_{cp}$ indicates the number of chips being repeated. The cyclic prefix ensures that the OFDM symbol retains its orthogonal properties in the presence of multipath delay spread caused by frequency selective fading (i.e., a frequency response that is not flat). Cyclic prefix generator 664 provides a sequence of OFDM symbols for the sequence of transmit symbols, which is further conditioned by an associated TX RF unit 666 to generate a modulated signal.

FIG. 7A shows the demultiplexing of a data symbol block for an exemplary MIMO-OFDM system with four transmit antennas ($N_T$=4) and 16 subbands ($N_F$=16). The data symbol block may be denoted as $\{s\}=[s_1 s_2 \ldots s_{N_{SYM}}]$. For the embodiment shown in FIG. 7A, the demultiplexing is performed such that the first four data symbols $s_1$ through $s_4$ in the block are sent on subband 1 of transmit antennas 1 through 4, respectively, the next four data symbols $s_5$ through $s_8$ are sent on subband 2 of transmit antennas 1 through 4, respectively, and so on.

Figure 6D:
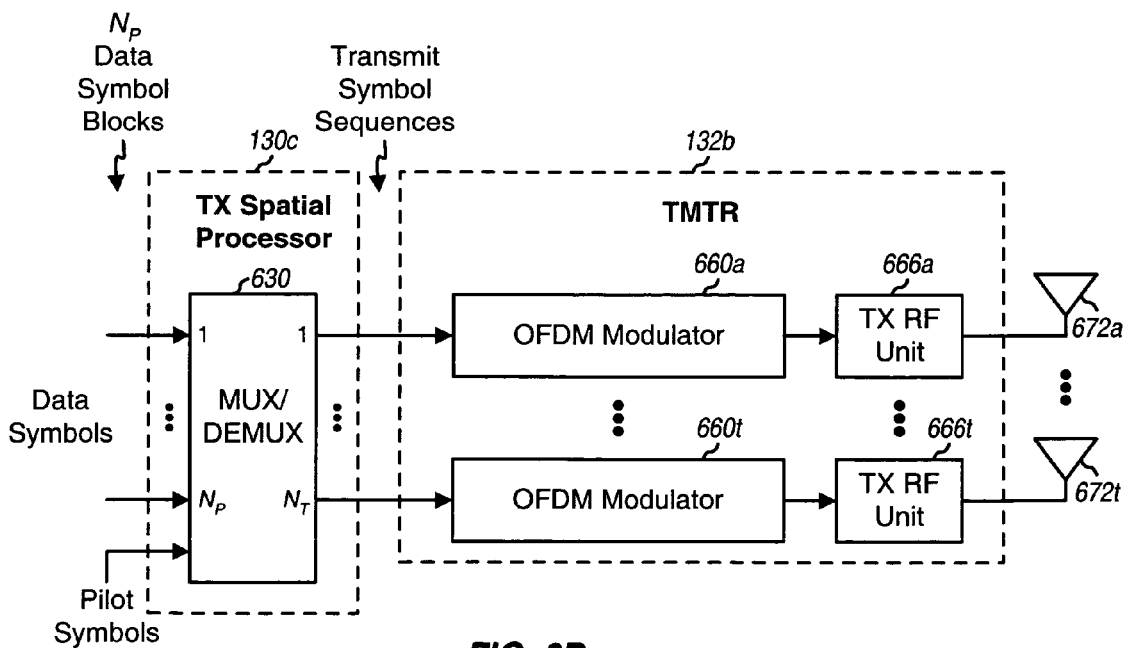

FIG. 6D shows a block diagram of a TX spatial processor 130c and transmitter unit 132b, which may be used for IR transmission of multiple packets simultaneously in a MIMO-OFDM system. Within TX spatial processor 130c, a multiplexer/demultiplexer 630 receives $N_P$ data symbol blocks, where $1 \leq N_P \leq N_S$, and provides the data symbols in each block to different subbands and different transmit antennas, as illustrated below. Multiplexer/demultiplexer 630 also multiplexes in pilot symbols and provides $N_T$ transmit symbol sequences for the $N_T$ transmit antennas.

FIG. 7B shows an embodiment of the multiplexing/demultiplexing of two data symbol blocks ($N_P$=2) for the exemplary MIMO-OFDM system with four transmit antennas ($N_T$=4) and 16 subbands. For the first data symbol block, the first four data symbols $s_{1,1}$, $s_{1,2}$, $s_{1,3}$ and $s_{1,4}$ are transmitted on subbands 1, 2, 3 and 4, respectively, of transmit antennas 1, 2, 3 and 4, respectively. The next four data symbols $s_{1,5}$, $s_{1,6}$, $s_{1,7}$ and $s_{1,8}$ wrap around and are transmitted on subbands 5, 6, 7 and 8, respectively, of transmit antennas 1, 2, 3 and 4, respectively. For the second data symbol block, the first four data symbols $s_{2,1}$, $s_{2,2}$, $s_{2,3}$ and $s_{2,4}$ are transmitted on subbands 1, 2, 3 and 4, respectively, of transmit antennas 3, 4, 1 and 2, respectively. The next four data symbols $s_{2,5}$, $s_{2,6}$, $s_{2,7}$ and $s_{2,8}$ wrap around and are transmitted on subbands 5, 6, 7 and 8, respectively, of transmit antennas 3, 4, 1 and 2, respectively. For the embodiment shown in FIG. 7B, the set of $N_F$ frequency-domain values for each transmit antenna for each symbol period includes transmit symbols for some subbands and zeros for other subbands.

FIG. 7B shows the transmission of two data symbol blocks simultaneously across the $N_F$ subbands and $N_T$ transmit antennas. In general, any number of data symbol blocks may be transmitted simultaneously across the subbands and transmit antennas. For example, one, two, three, or four data symbol blocks may be transmitted simultaneously in FIG. 7B. However, the number of data symbol blocks that may be reliably transmitted at the same time is dependent on the rank of the MIMO channel, so that $N_P$ should be less than or equal to $N_S$. The transmission scheme shown in FIG. 7B allows for easy adaptation of the transmission of different numbers of data symbol blocks simultaneously based on the rank of the MIMO channel.

For the embodiment shown in FIG. 7B, each data symbol block is transmitted diagonally across the $N_F$ subbands and from all $N_T$ transmit antennas. This provides both frequency and spatial diversity for all $N_P$ data symbol blocks being transmitted simultaneously, which allows a single rate to be used for all data packets. However, different rates may also be used for different data packets transmitted simultaneously. The use of different rates may provide better performance for some receivers such as, for example, a linear receiver that does not implement the IDD scheme. IR transmission of multiple data packets with different rates simultaneously is described in commonly assigned U.S. patent application Ser.

No. 10/785,292, entitled "Incremental Redundancy Transmission for Multiple Parallel Channels in a MIMO Communication System," filed Feb. 23, 2004.

The multiplexing/demultiplexing may also be performed in other manners while achieving both frequency and spatial diversity. For example, the multiplexing/demultiplexing may be such that all $N_F$ subbands of each transmit antenna are used to carry transmit symbols. Since the full power of each transmit antenna is limited to $P_{ant}$, the amount of transmit power available for each transmit symbol is dependent on the number of subbands carrying transmit symbols.

Referring back to FIG. 6D, transmitter unit 132b receives and conditions the $N_T$ transmit symbol sequences from TX spatial processor 130c and generates $N_T$ modulated signals.

2. Receiver

Figure 8A:
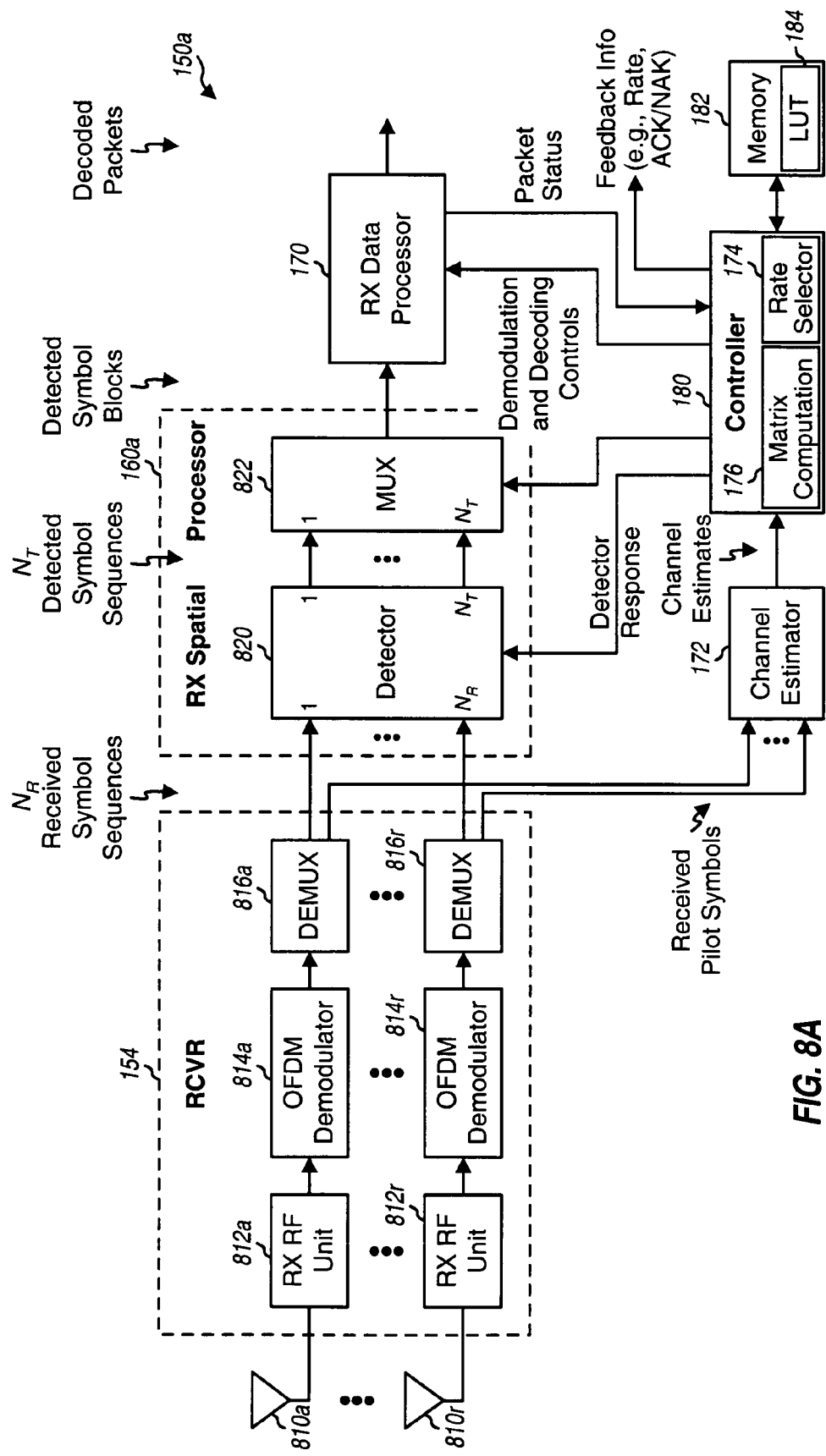
FIG. 8A shows one embodiment of the receiver.

FIG. 8A shows a block diagram of a receiver 150a, which is one embodiment of receiver 150 in FIG. 1. At receiver 150a, $N_R$ receive antennas 810a through 810r receive the $N_T$ modulated signals transmitted by transmitter 110 and provide $N_R$ received signals to $N_R$ RX RF units 812a through 812r, respectively, within receiver unit 154. Each RX RF unit 812 conditions and digitizes its received signal and provides a stream of symbols/chips. For a single-carrier MIMO system, OFDM demodulators 814a through 814r are not needed, and each RX RF unit 812 provides a stream of symbols directly to a respective demultiplexer 816. For a MIMO-OFDM system, each RX RF unit 812 provides a stream of chips to a respective OFDM demodulator 814. Each OFDM demodulator 814 performs OFDM demodulation on its stream of chips by (1) removing the cyclic prefix in each received OFDM symbol to obtain a received transformed symbol and (2) transforming each received transformed symbol to the frequency domain with a fast Fourier transform (FFT) to obtain $N_F$ received symbols for the $N_F$ subbands. For both systems, demultiplexers 816a through 816r receive $N_R$ symbol streams from RX RF units 812 or OFDM demodulators 814, provide $N_R$ sequences of received symbols (for data) for each slot to RX spatial processor 160a, and provide received pilot symbols to channel estimator 172.

RX spatial processor 160a includes a detector 820 and a multiplexer 822. Detector 820 performs spatial or space-time processing (or "detection") on the $N_R$ received symbol sequences to obtain $N_T$ detected symbol sequences. Each detected symbol is an estimate of a data symbol transmitted by the transmitter. Detector 820 may implement a maximal ratio combining (MRC) detector, a linear zero-forcing (ZF) detector (which is also referred to as a channel correlation matrix inversion (CCMI) detector), a minimum mean square error (MMSE) detector, an MMSE linear equalizer (MMSE-LE), a decision feedback equalizer (DFE), or some other detector/equalizer. The detection may be performed based on an estimate of the channel response matrix H if spatial processing is not performed at the transmitter. Alternatively, the detection may be performed based on the effective channel response matrix $H_{eff}$=HM, if the data symbols are pre-multiplied with the transmit basis matrix M at the transmitter for a single-carrier MIMO system. For simplicity, the following description assumes that the transmit basis matrix M was not used.

The model for a MIMO-OFDM system may be expressed as:

$$r(k)=H(k)s(k)+n(k), \text{ for } k=1\ldots N_F, \quad \text{Eq (2)}$$

where s(k) is an $\{N_T \times 1\}$ data vector with $N_T$ entries for $N_T$ data symbols transmitted from the $N_T$ transmit antennas on subband k;

r(k) is an $\{N_R \times 1\}$ receive vector with $N_R$ entries for $N_R$ received symbols obtained via the $N_R$ receive antennas on subband k;

H(k) is the $\{N_R \times N_T\}$ channel response matrix for subband k; and n(k) is a vector of additive white Gaussian noise (AWGN). The vector n(k) is assumed to have zero mean and a covariance matrix of $\Lambda_n = \sigma^2 I$, where $\sigma^2$ is the variance of the noise and I is the identity matrix with ones along the diagonal and zeros everywhere else.

For a MIMO-OFDM system, the receiver performs detection separately for each of the subbands used for data transmission. The following description is for one subband, and for simplicity the subband index k is omitted in the mathematical derivation. The following description is also applicable for a single-carrier MIMO system. For simplicity, the vector s is assumed to include $N_T$ data symbols sent from the $N_T$ transmit antennas.

The spatial processing by an MRC detector may be expressed as:

$$\hat{\underline{s}}_{mrc} = \underline{W}_{mrc}^H \underline{r}, \quad \text{Eq (3)}$$

where $W_{mrc}$ is the response of the MRC detector, which is $W_{mrc}$=H;
$\hat{s}_{mrc}$ is an $\{N_T \times 1\}$ vector of detected symbols for the MRC detector; and
"$^H$" denotes the conjugate transpose.

The detected symbol for transmit antenna i may be expressed as $$\hat{s}_{mrc,i} = \underline{w}_{mrc,i}^H \underline{r},$$

where $w_{mrc,i}$ is the i-th column of $W_{mrc}$ and is given as $w_{mrc,i}$= $h_i$, where $h_i$ is the channel response vector between transmit antenna i and the $N_R$ receive antennas.

The spatial processing by an MMSE detector may be expressed as:

$$\hat{\underline{s}}_{mmse} = \underline{W}_{mmse}^H \underline{r}, \quad \text{Eq (4)}$$

where $W_{mmse}=(HH^H+\sigma^2 I)^{-1}H$ for the MMSE detector. The MMSE detector response for transmit antenna i may be expressed as $w_{mmse,i}=(HH^H+\sigma^2 I)^{-1}h_i$.

The spatial processing by a zero-forcing detector may be expressed as:

$$\hat{s}_{zf} = W_{zf}^H r, \quad \text{Eq (5)}$$

where $W_{zf}=H(H^H H)^{-1}$ for the zero-forcing detector. The zero-forcing detector response for transmit antenna i may be expressed as $w_{zf,i}=h_i(H^H H)^{-1}$.

For each slot, detector 820 provides $N_T$ detected symbol sequences that correspond to the $N_T$ entries of $\hat{s}$. Multiplexer 822 receives the $N_T$ detected symbol sequences from detector 820 and performs processing complementary to that performed by TX spatial processor 130 at the transmitter. If only one data symbol block is transmitted in each slot, such as for TX spatial processor 130a in FIGS. 6A and 6C, then multiplexer 822 multiplexes the detected symbols in the $N_T$ sequences into one detected symbol block. If multiple data symbol blocks are transmitted in each slot, such as for TX spatial processors 130b and 130c in FIGS. 6B and 6D, respectively, then multiplexer 822 multiplexes and demultiplexes the detected symbols in the $N_T$ sequences into $N_P$ detected symbol blocks (not shown in FIG. 8A). In any case, each detected symbol block is an estimate of a data symbol block transmitted by the transmitter.

Channel estimator 172 estimates the channel response matrix H for the MIMO channel and the noise floor at the receiver (e.g., based on received pilot symbols) and provides channel estimates to controller 180. Within controller 180, a matrix computation unit 176 derives the detector response W (which may be $W_{mrc}$, $W_{mmse}$, or $W_{zf}$) based on the estimated channel response matrix, as described above, and provides the detector response to detector 820. Detector 820 pre-multiplies the vector r of received symbols with the detector response W to obtain the vector ŝ of detected symbols. Rate selector 174 (which is implemented by controller 180 for the receiver embodiment shown in FIG. 8A) performs rate selection based on the channel estimates, as described below. A look-up table (LUT) 184 stores a set of rates supported by the MIMO system and a set of parameter values associated with each rate (e.g., the data rate, packet size, coding scheme or code rate, modulation scheme, and so on for each rate). Rate selector 174 accesses LUT 184 for information used for rate selection.

Figure 8B:
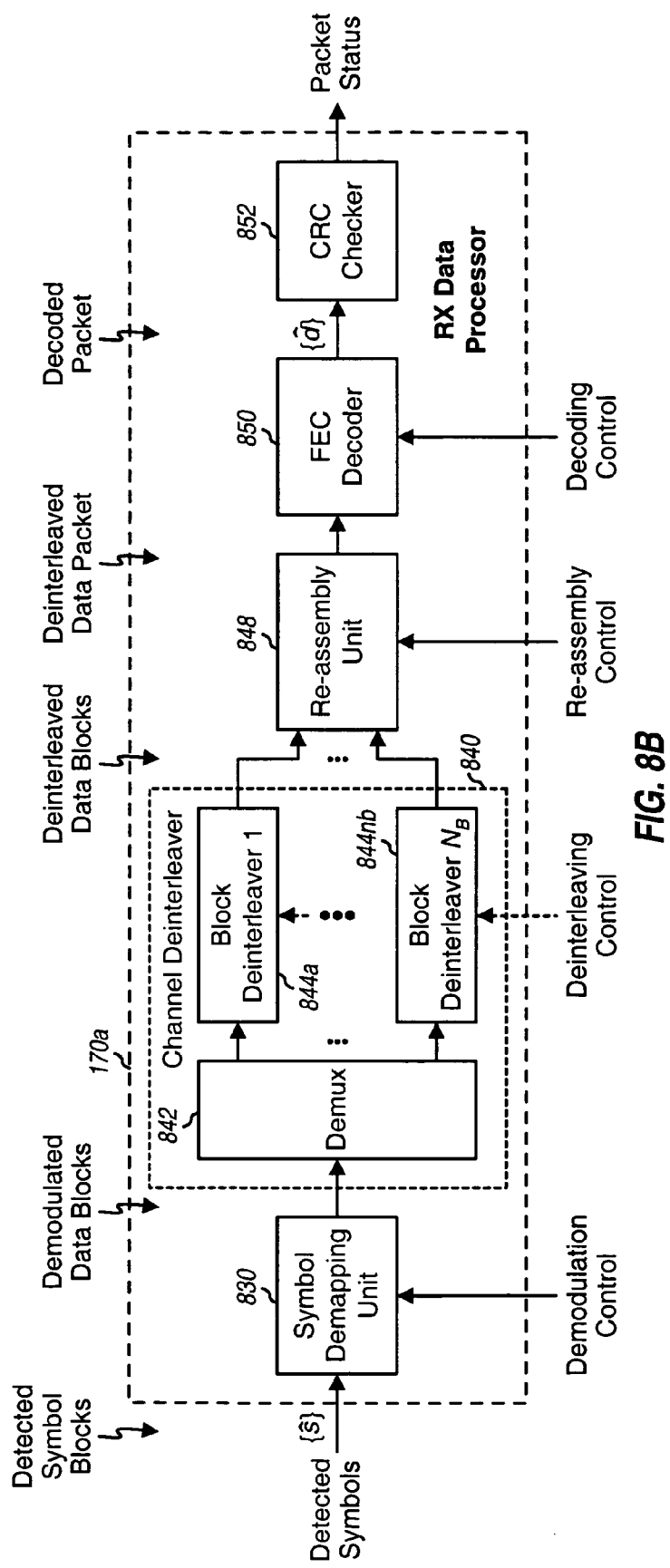
FIG. 8B shows a receive (RX) data processor at the receiver in FIG. 8A.

FIG. 8B shows a block diagram of an RX data processor 170a, which is one embodiment of RX data processor 170 in FIGS. 1 and 8A. Within RX data processor 170a, a symbol demapping unit 830 receives detected symbols blocks from RX spatial processor 160a, one block at a time. For each detected symbol block, symbol demapping unit 830 demodulates the detected symbols in accordance with the modulation scheme used for that block (as indicated by a demodulation control from controller 180) and provides a demodulated data block to a channel deinterleaver 840. Channel deinterleaver 840 includes a demultiplexer 842 and $N_B$ block deinterleavers 844a through 844nb. Prior to receiving a new data packet, block deinterleavers 844a through 844nb are initialized with erasures. An erasure is a value that substitutes for a missing code bit (i.e., one not yet received) and is given appropriate weight in the decoding process. Multiplexer 842 receives demodulated data blocks from symbol demapping unit 830 and provides each demodulated data block to the proper block deinterleaver 844. Each block deinterleaver 844 deinterleaves the demodulated data in its block in a manner complementary to the interleaving performed at the transmitter for that block. If the interleaving is dependent on the selected rate, then controller 180 provides a deinterleaving control to block deinterleavers 844, as indicated by the dashed line.

Whenever a new data symbol block is received from the transmitter for a data packet, the decoding is performed anew on all blocks received for that packet. A re-assembly unit 848 forms a packet of deinterleaved data for subsequent decoding. The deinterleaved data packet contains (1) deinterleaved data blocks for all data symbol blocks received for the current packet and (2) erasures for data symbol blocks not received for the current packet. Re-assembly unit 848 performs re-assembly in a complementary manner to the partitioning performed by the transmitter, as indicated by a re-assembly control from controller 180.

An FEC decoder 850 decodes the deinterleaved data packet in a manner complementary to the FEC encoding performed at the transmitter, as indicated by a decoding control from controller 180. For example, a Turbo decoder or a Viterbi decoder may be used for FEC decoder 850 if Turbo or convolutional coding, respectively, is performed at the transmitter. FEC decoder 850 provides a decoded packet for the current packet. A CRC checker 852 checks the decoded packet to determine whether the packet is decoded correctly or in error and provides the status of the decoded packet.

Figure 9A:
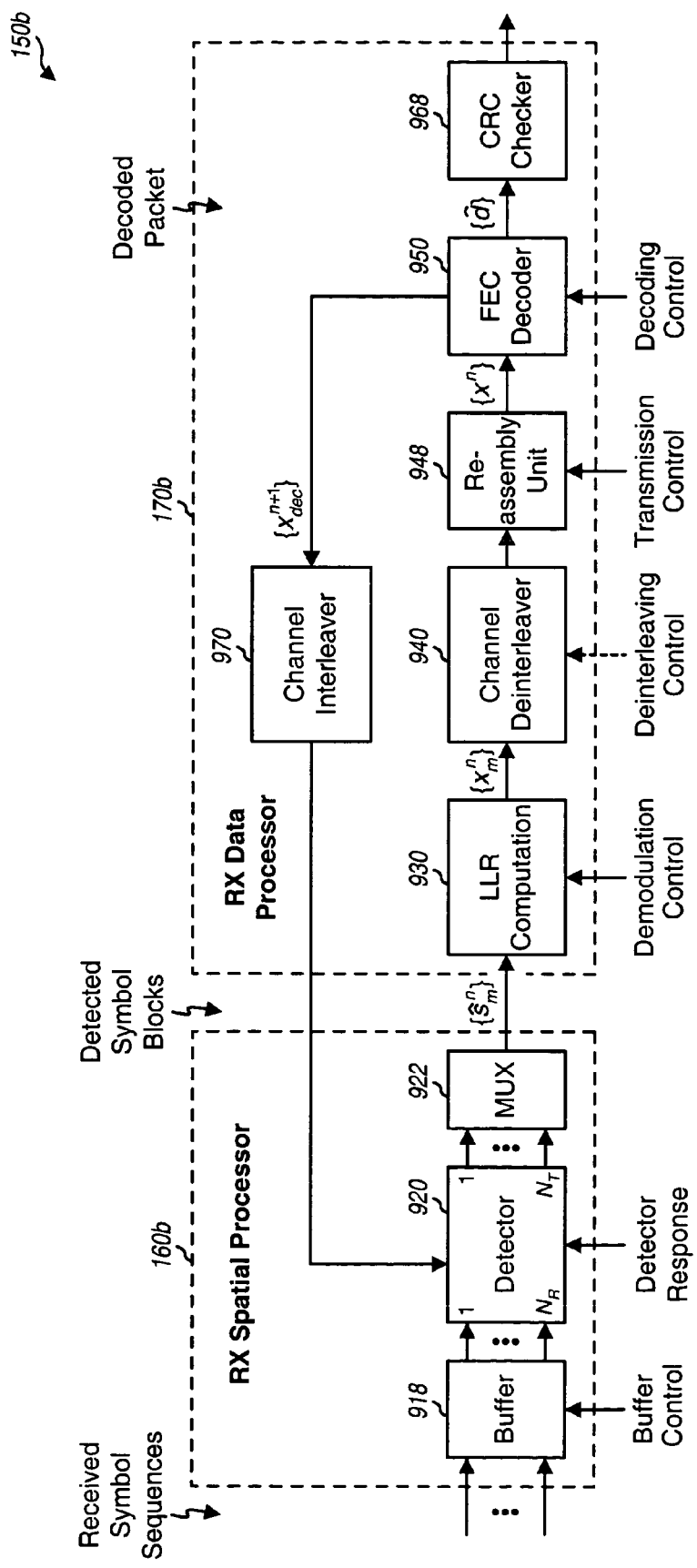
FIG. 9A shows a receiver that implements iterative detection and decoding.

FIG. 9A shows a block diagram of a receiver 150b, which is another embodiment of receiver 150 in FIG. 1. Receiver 150b implements an iterative detection and decoding (IDD) scheme. For clarity, the IDD scheme is described below for the coding scheme shown in FIGS. 4B and 5, which codes a data packet into three parts—systematic bits $\{c_{data}\}$, first parity bits $\{c_{p1}\}$, and second parity bits $\{c_{p2}\}$.

Receiver 150b includes a detector 920 and an FEC decoder 950 that perform iterative detection and decoding on the received symbols for a data packet to obtain a decoded packet. The IDD scheme exploits the error correction capabilities of the channel code to provide improved performance. This is achieved by iteratively passing a priori information between detector 920 and FEC decoder 950 for $N_{dd}$ iterations, where $N_{dd} > 1$, as described below. The a priori information indicates the likelihood of the transmitted bits.

Receiver 150b includes an RX spatial processor 160b and an RX data processor 170b. Within RX spatial processor 160b, a buffer 918 receives and stores the $N_R$ received symbol sequences provided by receiver unit 154 for each slot. Whenever a new data symbol block is received from the transmitter for a data packet, the iterative detection and decoding is performed anew (i.e., from the start) on the received symbols for all blocks received for that packet. Detector 920 performs spatial processing or detection on the $N_R$ received symbol sequences for each received block and provides $N_T$ detected symbol sequences for that block. Detector 920 may implement an MRC detector, a zero-forcing detector, an MMSE detector, or some other detector/equalizer. For clarity, detection with an MMSE detector is described below.

For an MMSE detector with iterative detection and decoding, the detected symbol $\hat{s}_i$ for transmit antenna i may be expressed:

$$\hat{s}_i = w_i^H r - u_i, \text{ for } i=1 \ldots N_T, \quad \text{Eq (6)}$$

where $w_i$ and $u_i$ are derived based on an MMSE criterion, which can be expressed as:

$$(\underline{w}_i, u_i) = \min_{(\underline{w}_i, u_i)} E[|s_i - \hat{s}_i|^2]. \quad \text{Eq (7)}$$

The solutions to the optimization problem posed in equation (7) can be expressed as:

$$\underline{w}_i = (\underline{P} + \underline{Q} + \sigma^2 I)^{-1} \underline{h}_i, \text{ and} \quad \text{Eq (8)}$$

$$u_i = \underline{w}_i^H z, \text{ with} \quad \text{Eq (9)}$$

$$\underline{P} = \underline{h}_i \underline{h}_i^H, \quad \text{Eq (10)}$$

$$\underline{Q} = \underline{H}_i [E[(\underline{s}_i - E[\underline{s}_i])(\underline{s}_i - E[\underline{s}_i])^H]] \underline{H}_i^H \quad \text{Eq (11)}$$

$$= \underline{H}_i [VAR[\underline{s}_i]] \underline{H}_i^H, \text{ and}$$

$$z = \underline{H}_i E[\underline{s}_i], \quad \text{Eq (12)}$$

where $h_i$ is the i-th column of the channel response matrix H;
$H_i$ is equal to H with the i-th column set to zero;
$s_i$ is an $\{(N_T-1) \times 1\}$ vector obtained by removing the i-th element of s;
E[a] is the expected values of the entries of vector a; and
VAR[$aa^H$] is a covariance matrix of vector a.
The matrix P is the outer product of the channel response vector $h_i$ for transmit antenna i. The matrix Q is the covariance matrix of the interference to transmit antenna i. The vector z is the expected value of the interference to transmit antenna i.

Equation (6) can be simplified as:

$$\hat{s}_i = \alpha_i s_i + \eta_i, \text{ for } i=1 \ldots N_T, \quad \text{Eq (13)}$$

where $\alpha_i = w_i^H h_i$ and $\eta_i$ is a Gaussian noise sample with zero mean and variance of $v_i = w_i^H h_i - (w_i^H h_i)^2$. The Gaussian noise sample $\eta_i$ assumes that the interference from other transmit antennas is Gaussian after the MMSE detector.

In the following description, the superscript n denotes the n-th detection/decoding iteration and the subscript m denotes the m-th data symbol block received for the current packet being recovered. For the first iteration (i.e., n=1) the detection is based solely on the received symbols since no a priori information is available from the FEC decoder. Hence, bits with equal probability of being '1' or '0' are assumed. In this case, equation (8) reduces to a linear MMSE detector, which can be given as $w_i = (HH^H + \sigma^2 I)^{-1} h_i$. For each subsequent iteration (i.e., n>1), the a priori information provided by the FEC decoder is used by the detector. As the number of iterations increases, the interference reduces and the detector converges to the MRC detector that achieves full diversity.

For each data symbol block received for the current packet, detector 920 in FIG. 9A performs detection on $N_R$ received symbol sequences for that block and provides $N_T$ detected symbol sequences. A multiplexer 922 multiplexes the detected symbols in the $N_T$ sequences to obtain a detected symbol block, which is provided to RX data processor 170b. The detected symbol block obtained in the n-th detection/decoding iteration for the m-th data symbol block is denoted as $\{\hat{s}_m^n\}$.

Within RX data processor 170b, a log-likelihood ratio (LLR) computation unit 930 receives the detected symbols from RX spatial processor 160b and computes the LLRs of the B code bits for each detected symbol. Each detected symbol $\hat{s}_i$ is an estimate of the data symbol $s_i$, which is obtained by mapping B code bits $b_i = [b_{i,1} \, b_{i,2} \ldots b_{i,B}]$ to a point in a signal constellation. The LLR for the j-th bit of detected symbol $\hat{s}_i$ may be expressed as:

$$x_{i,j} = \log\left[\frac{Pr(\hat{s}_i \mid b_{i,j} = 1)}{Pr(\hat{s}_i \mid b_{i,j} = -1)}\right], \quad \text{Eq (14)}$$

where $b_{i,j}$ is the j-th bit for detected symbol $\hat{s}_i$;
Pr $(\hat{s}_i \mid b_{i,j}=1)$ is the probability of detected symbol $\hat{s}_i$ with bit $b_{i,j}$ being 1;
Pr $(\hat{s}_i \mid b_{i,j}=-1)$ is the probability of detected symbol $\hat{s}_i$ with bit $b_{i,j}$ being -1 (i.e., '0'); and
$x_{i,j}$ is the LLR of bit $b_{i,j}$.

The LLRs $\{x_{i,j}\}$ represent the a priori information provided by the detector to the FEC decoder, and are also referred to as the detector LLRs.

For simplicity, the interleaving is assumed to be such that the B bits for each detected symbol $\hat{s}_i$ are independent. Equation (14) may then be expressed as:

$$x_{i,j} = \log\left[\frac{\sum_{s \in \Omega_{j,1}} \exp\left[\frac{-1}{2v_i^2}|\hat{s}_i - \alpha_i s|^2\right] \exp\left[\frac{1}{2} b_i^T(j) L_i(j)\right]}{\sum_{s \in \Omega_{j,-1}} \exp\left[\frac{-1}{2v_i^2}|\hat{s}_i - \alpha_i s|^2\right] \exp\left[\frac{1}{2} b_i^T(j) L_i(j)\right]}\right], \quad \text{Eq (15)}$$

where $\Omega_{j,q}$ is the set of points in the signal constellation whose j-th bit is equal to q, s is the modulation symbol or point in the set $\Omega_{j,q}$ being evaluated (i.e., the "hypothesized" symbol);
$\alpha_i$ is the gain for transmit antenna i and defined above;
$v_i$ is the variance of the Gaussian noise sample $\eta_i$ for detected symbol $\hat{s}_i$;
$b_i$ is the set of B bits for the hypothesized symbol s;
$b_i(j)$ is equal to bi with the j-th bit removed;
$L_i$ is a set of LLRs obtained from the FEC decoder for the B bits of the hypothesized symbol s;
$L_i(j)$ is equal to $L_i$ with the decoder LLR for the j-th bit removed (i.e., $L_i(j)=[\lambda_{i,1}, \ldots, \lambda_{i,j-1}, \lambda_{i,j+1}, \ldots, \lambda_{i,B}]$); and
"T" denotes the transpose.

The decoder LLR for the (i, j)-th bit can be expressed as:

$$\lambda_{i,j} = \log\left[\frac{Pr(b_{i,j} = 1)}{Pr(b_{i,j} = -1)}\right], \quad \text{Eq (16)}$$

where Pr $(b_{i,j}=1)$ is the probability of bit $b_{i,j}$ being 1; and
Pr $(b_{i,j}=-1)$ is the probability of bit $b_{i,j}$ being -1.

For the first iteration (n=1), all of the entries of $L_i$ (j) are set to zeros to denote equal probability of each bit being 1 or -1, since no a priori information is available for the bit. For each subsequent iteration, the entries of $L_i$ (j) are computed based on the "soft" values for the bits from the FEC decoder. LLR computation unit 930 provides LLRs for the code bits of each detected symbol received from RX spatial processor 160b. The block of LLRs obtained in the n-th detection/decoding iteration for the m-th data symbol block is denoted as $\{x_m^n\}$.

A channel deinterleaver 940 receives and deinterleaves each block of LLRs from LLR computation unit 930 and provides deinterleaved LLRs for the block. A re-assembly unit 948 forms a packet of LLRs that contains (1) blocks of deinterleaved LLRs from channel deinterleaver 940 for all data symbol blocks received from the transmitter and (2) blocks of zero-value LLRs for data symbol blocks not received. The packet of LLRs for the n-th detection/decoding iteration is denoted as $\{x^n\}$. FEC decoder 950 receives and decodes the packet of LLRs from re-assembly unit 948, as described below.

Figure 9B:
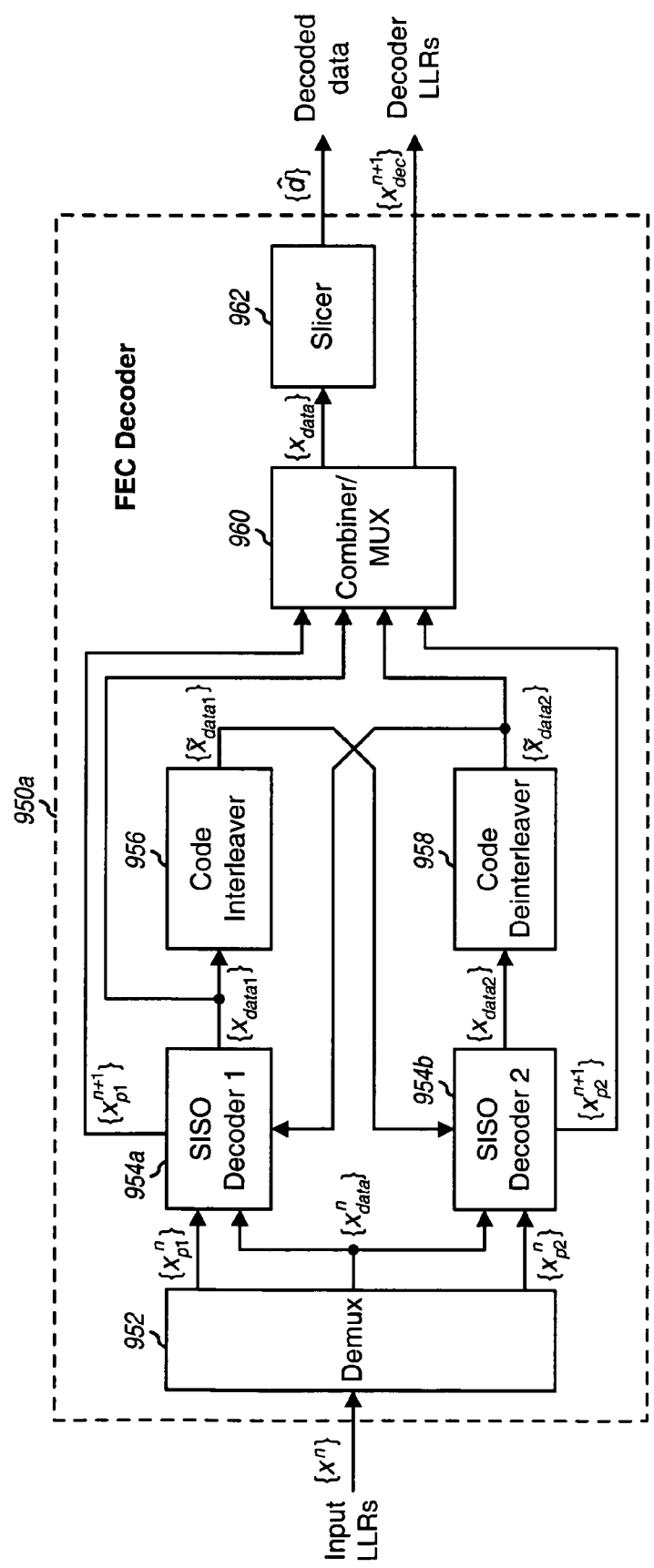
FIG. 9B shows a Turbo decoder.

FIG. 9B shows a block diagram of a Turbo decoder 950a, which may be used for FEC decoders 950 and 850 in FIGS. 9A and 8B, respectively. Turbo decoder 950a performs iterative decoding for a parallel concatenated convolutional code, such as the one shown in FIG. 4B.

Within Turbo decoder 950a, a demultiplexer 952 receives and demultiplexes the packet of LLRs $\{x^n\}$ from re-assembly unit 948 (which is also denoted as the input LLRs) into data bit LLRs $\{x_{data}^n\}$, first parity bit LLRs $\{x_{p1}^n\}$, and second parity bit LLRs $\{x_{p2}^n\}$. A soft-input soft-output (SISO) decoder 954a receives the data bit LLRs $\{x_{data}^n\}$ and the first parity bit LLRs $\{x_{p1}^n\}$ from demultiplexer 952 and deinterleaved data bit LLRs $\{\tilde{x}_{data2}\}$ from a code deinterleaver 958. SISO decoder 954a then derives new LLRs for the data and first parity bits, $\{x_{data1}\}$ and $\{x_{p1}^{n=1}\}$, based on the first constituent convolutional code. A code interleaver 956 interleaves the data bit LLRs $\{x_{data1}\}$ in accordance with the code interleaving scheme used at the transmitter and provides interleaved data bit LLRs $\{\tilde{x}_{data1}\}$. Similarly, a SISO decoder 954b receives the data bit LLRs $\{x_{data}^n\}$ and the second parity bit LLRs $\{x_{p2}^n\}$ from demultiplexer 952 and the interleaved data bit LLRs $\{\tilde{x}_{data1}\}$ from code interleaver 956. SISO decoder 954b then derives new LLRs for the data and second parity bits, $\{x_{data2}\}$ and $\{x_{p2}^{n+1}\}$, based on the second constituent convolutional code. Code deinterleaver 958 deinterleaves the data bit LLRs $\{x_{data2}\}$ in a complementary manner to the code interleaving and provides the deinterleaved data bit LLRs $\{\tilde{x}_{data2}\}$. SISO decoders 954a and 954b may implement a BCJR SISO maximum a posteriori (MAP) algorithm or its lower complexity derivatives, a soft-output Viterbi (SOV) algorithm, or some other decoding algorithm, which are known in the art.

The decoding by SISO decoders 954a and 954b is iterated $N_{dec}$ times for the current detection/decoding iteration n, where $N_{dec} \geq 1$. After all $N_{dec}$ decoding iterations have been completed, a combiner/multiplexer 960 receives the final data bit LLRs $\{x_{data1}\}$ and the final first parity bit LLRs $\{x_{p1}^{n+1}\}$ from SISO decoder 954a, the deinterleaved final data bit LLRs $\{\tilde{x}_{data2}\}$ from code deinterleaver 958, and the final second parity bit LLRs $\{x_{p2}^{n+1}\}$ from SISO decoder 954b. Combiner/multiplexer 960 then computes decoder LLRs $\{x_{dec}^{n+1}\}$ for the next detection/decoding iteration n+1 as follows: $\{x_{dec}^{n+1}\} = \{x_{data1} + \tilde{x}_{data2}, x_{p1}^{n+1}, x_{p2}^{n+1}\}$. The decoder LLRs $\{x_{dec}^{n+1}\}$ correspond to $\lambda_{i,j}$ in equation (16) and represent the a priori information provided by the FEC decoder to the detector.

After all $N_{dd}$ detection/decoding iterations have been completed, combiner/multiplexer 960 computes the final data bit LLRs $\{x_{data}\}$ as follows: $\{x_{data}\} = \{x_{data}^{N_{dd}} + x_{data1} + \tilde{x}_{data2}\}$, where $\{x_{data}^{N_{dd}}\}$ is the data bit LLRs provided by LLR computation unit 930 for the last detection/decoding iteration. A slicer 962 slices the final data bit LLRs $\{x_{data}\}$ and provides the decoded packet $\{\hat{d}\}$ for the packet being recovered. A CRC checker 968 checks the decoded packet and provides the packet status.

Referring back to FIG. 9A, the decoder LLRs $\{x_{dec}^{n+1}\}$ from FEC decoder 950 are interleaved by a channel interleaver 970, and the interleaved decoder LLRs are provided to detector 920. Detector 920 derives new detected symbols $\{\hat{s}_m^{n+1}\}$ based on the received symbols $\{r_m\}$ and the decoder LLRs $\{x_{dec}^{n+1}\}$. The decoder LLRs $\{x_{dec}^{n+1}\}$ are used to compute (a) the expected value of the interference (i.e., $E[s_i]$), which is used to derive z in equation (12), and (b) the variance of the interference (i.e., $VAR[S_i]$), which is used to derive Q in equation (11).

The detected symbols $\{\hat{s}_m^{n+1}\}$ for all received data symbol blocks from RX spatial processor 160a are again decoded by RX data processor 170b, as described above. The detection and decoding process is iterated $N_{dd}$ times. During the iterative detection and decoding process, the reliability of the detected symbols improves with each detection/decoding iteration.

As shown in equation (8), the MMSE detector response $w_i$ is dependent on Q, which in turn is dependent on the variance of the interference, $VAR[s_i]$. Since Q is different for each detection/decoding iteration, the MMSE detector response $w_i$ is also different for each iteration. To simplify receiver 150b, detector 920 may implement (1) an MMSE detector for $N_{dd1}$ detection/decoding iterations and then (2) an MRC detector (or some other type of detector/equalizer having a response that does not change with iteration) for $N_{dd2}$ subsequent detection/decoding iterations, where $N_{dd1}$ and $N_{dd2}$ can each be one or greater. For example, an MMSE detector may be used for the first detection/decoding iteration and an MRC detector may be used for the next five detection/decoding iterations. As another example, an MMSE detector may be used for the first two detection/decoding iterations and an MRC detector may be used for the next four detection/decoding iterations.

The MRC detector may be implemented with the term $u_i$, as shown in equation (6), where $w_{mrc,i}$ replaces $w_i$. As shown in equations (6), (9), and (12), the term $u_i$ is dependent on the expected value of the interference, $E[s_i]$. To further simplify receiver 150b, the term $u_i$ may be omitted after switching from the MMSE detector to the MRC detector.

The iterative detection and decoding scheme provides various advantages. For example, the IDD scheme supports the use of a single rate for all data packets transmitted simultaneously via the $N_T$ transmit antennas, can combat frequency selective fading, and may flexibly be used with various coding and modulation schemes, including the parallel concatenated convolutional code shown in FIG. 4B.

3. Rate Selection

For both single-carrier MIMO and MIMO-OFDM systems, the receiver and/or transmitter can estimate the MIMO channel and select a suitable rate for data transmission on the MIMO channel. The rate selection may be performed in various manners. Some exemplary rate selection schemes are described below.

In a first rate selection scheme, the rate for data transmission on the MIMO channel is selected based on a metric, which is derived using an equivalent system that models the channel responses for the $N_T$ transmit antennas. The equivalent system is defined to have an AWGN channel (i.e., with a flat frequency response) and a spectral efficiency that is equal to the average spectral efficiency of the $N_T$ transmit antennas. The equivalent system has a total capacity equal to the total capacity of the $N_T$ transmit antennas. The average spectral efficiency may be determined by (1) estimating the received SNR for each transmit antenna (e.g., based on received pilot and/or data symbols), (2) computing the spectral efficiency of each transmit antenna from the received SNR and based on a (constrained or unconstrained) spectral efficiency function, $f(x)$, and (3) computing the average spectral efficiency of the $N_T$ transmit antennas based on the spectral efficiencies of the individual transmit antennas. The metric may be defined as the SNR needed by the equivalent system to support the average spectral efficiency. This SNR may be determined from the average spectral efficiency and based on an inverse function, $f^{-1}(x)$.

The system may be designed to support a set of rates. One of the supported rates may be for a null rate (i.e., a data rate of zero). Each of the remaining rates is associated with a particular non-zero data rate, a particular coding scheme or code rate, a particular modulation scheme, and a particular minimum SNR required to achieve the target level of performance (e.g., 1% PER) for an AWGN channel. For each supported rate with a non-zero data rate, the required SNR is obtained based on the specific system design (i.e., the particular code rate, interleaving scheme, modulation scheme, and so on, used by the system for that rate) and for an AWGN channel. The required SNR may be obtained by computer simulation, empirical measurements, and so on, as is known in the art. The set of supported rates and their required SNRs may be stored in a look-up table (e.g., LUT 184 in FIG. 8A).

The metric may be compared against the required SNR for each of the rates supported by the system. The highest rate with a required SNR that is less than or equal to the metric is selected for use for data transmission on the MIMO channel. The first rate selection scheme is described in detail in commonly assigned U.S. patent application Ser. No. 10/176,567, entitled "Rate Control for Multi-Channel Communication Systems," filed Jun. 20, 2002.

In a second rate selection scheme, the rate for data transmission on the MIMO channel is selected based on the received SNRs for the $N_T$ transmit antennas. The received SNR for each transmit antenna is first determined, and an average received SNR, $\gamma_{rx,avg}$, is then computed for the $N_T$ transmit antennas. An operating SNR, $\gamma_{op}$, is next computed for the $N_T$ transmit antennas based on the average received SNR, $\gamma_{rx,avg}$, and an SNR offset or back-off factor, $\gamma_{os}$ (e.g., $\gamma_{op} = \gamma_{rx} + \gamma_{os}$, where the units are in dB). The SNR offset is used to account for estimation error, variability in the MIMO channel, and other factors. The operating SNR, $\gamma_{op}$, may be compared against the required SNR for each of the rates supported by the system. The highest rate with a required SNR that is less than or equal to the operating SNR (i.e., $\gamma_{req} \leq \gamma_{op}$) is selected for use for data transmission on the MIMO channel. The second rate selection scheme is described in detail in commonly assigned U.S. patent application Ser. No. 10/394, 529 entitled "Transmission Mode Selection for Data Transmission in a Multi-Channel Communication System," filed Mar. 20, 2003.

The IR transmission techniques described herein may be implemented by various means. For example, these techniques may be implemented in hardware, software, or a combination thereof. For a hardware implementation, the processing units used at the transmitter for IR transmission may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. The processing units used at the receiver for receiving an IR transmission may also be implemented within one or more ASICs, DSPs, DSPDs, PLDs, FPGAs, processors, controllers, and so on.

For a software implementation, the IR transmission techniques may be implemented with modules (e.g., procedures, functions, and so on) that perform the functions described herein. The software codes may be stored in a memory unit (e.g., memory units 142 and 182 in FIG. 1) and executed by a processor (e.g., controllers 140 and 180). The memory unit may be implemented within the processor or external to the processor, in which case it can be communicatively coupled to the processor via various means as is known in the art.

Headings are included herein for reference and to aid in locating certain sections. These headings are not intended to limit the scope of the concepts described therein under, and these concepts may have applicability in other sections throughout the entire specification.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of performing incremental redundancy (IR) transmission in a wireless multiple-input multiple-output (MIMO) communication system, comprising:

obtaining a selected rate for data transmission on a MIMO channel between a plurality of transmit antennas and a plurality of receive antennas, the selected rate indicating a particular data rate, or a particular coding scheme, or a particular code rate, or a particular modulation scheme, or a particular data packet size, or a combination thereof;

encoding a data packet in accordance with the selected rate to obtain a coded packet;

processing the coded packet to obtain a plurality of symbol blocks, each symbol block being generated based on a different portion of the coded packet;

transmitting a first symbol block of the plurality of symbol blocks from the plurality of transmit antennas to the plurality of receive antennas; and transmitting a second symbol block of the plurality of symbol blocks from the plurality of transmit antennas to the plurality of receive antennas, wherein the second symbol block is generated based on a different portion of the coded packet than the first symbol block, and wherein the plurality of symbol blocks are selected for transmission, one symbol block at a time, until an acknowledgement (ACK) is received for the data packet or all of the plurality of symbol blocks are transmitted, and wherein the second symbol block is selected for transmission when the ACK is not received for the data packet.

2. The method of claim 1, wherein the processing includes partitioning the coded packet into a plurality of coded subpackets, and modulating the plurality of coded subpackets in accordance with the particular modulation scheme indicated by the selected rate to obtain the plurality of symbol blocks.

3. The method of claim 1, wherein the coding scheme comprises a Turbo code, and wherein the first symbol block includes systematic bits for the data packet.

4. The method of claim 1, further comprising:

receiving a negative acknowledgment (NAK) for the data packet; and transmitting the second symbol block of the plurality of symbol blocks in response to receiving the NAK.

5. The method of claim 1, wherein the MIMO system utilizes orthogonal frequency division multiplexing (OFDM), and wherein each of the plurality of symbol blocks is transmitted on a plurality of subbands and from the plurality of transmit antennas if the symbol block is selected for transmission.

6. The method of claim 1, wherein at least two data packets are each processed in accordance with the selected rate to obtain at least two pluralities of symbol blocks, one plurality of symbol blocks for each data packet, and wherein at least two symbol blocks for the at least two data packets are transmitted simultaneously from the plurality of transmit antennas to the plurality of receive antennas.

7. The method of claim 1, further comprising:

transmitting the data packet and at least one additional data packet in an interlaced manner, wherein symbol blocks for each data packet are transmitted in slots spaced apart by a predetermined number of slots.

8. A method of performing incremental redundancy (IR) transmission in a wireless multiple-input multiple-output (MIMO) communication system, comprising:

encoding at least two data packets to obtain at least two coded packets, one coded packet for each data packet;

processing each coded packet to obtain a plurality of symbol blocks for the corresponding data packet, each symbol block being generated based on a different portion of the coded packet;

transmitting a first symbol block of the plurality of symbol blocks for each data packet from a plurality of transmit antennas to a plurality of receive antennas; and transmitting a second symbol block of the plurality of symbol blocks for each data packet from a plurality of transmit antennas to a plurality of receive antennas, wherein the second symbol block for each data packet is generated based on a different portion of the corresponding coded packet than the first symbol block, and wherein the plurality of symbol blocks for each data packet are selected for transmission, one symbol block at a time, until an acknowledgement (ACK) is received for the data packet or all of the plurality of symbol blocks are transmitted, wherein the second symbol block is selected for transmission when the ACK is not received for the data packet, wherein the MIMO system utilizes orthogonal frequency division multiplexing (OFDM), and wherein each symbol block for each data packet is transmitted on a plurality of subbands and from the plurality of transmit antennas.

9. The method of claim 1, wherein the MIMO system utilizes orthogonal frequency division multiplexing (OFDM), the method further comprising:
processing each of $N_p$ data packets in accordance with the selected rate to obtain one of $N_p$ pluralities of symbol blocks, one plurality of symbol blocks for each data packet, where $N_p$ is equal to or greater than one and is selected based on a rank of the MIMO channel, and
transmitting $N_p$ symbol blocks for the $N_p$ data packets simultaneously on a plurality of subbands and from the plurality of transmit antennas.

10. A transmitter operative to perform incremental redundancy (IR) transmission in a wireless multiple-input multiple-output (MIMO) communication system, comprising:
a transmit data processor operative to
obtain a selected rate for data transmission on a MIMO channel between a plurality of transmit antennas and a plurality of receive antennas, the selected rate indicating a particular data rate, or a particular coding scheme, or a particular code rate, or a particular modulation scheme, or a particular data packet size, or a combination thereof,
encode a data packet in accordance with the selected rate to obtain a coded packet, and
process the coded packet to obtain a plurality of symbol blocks, each symbol block being generated based on a different portion of the coded packet; and
a controller operative to
initiate transmission of a first symbol block of the plurality of symbol blocks from the plurality of transmit antennas to the plurality of receive antennas; and
initiate transmission of a second symbol block of the plurality of symbol blocks from the plurality of transmit antennas to the plurality of receive antennas, wherein the second symbol block is generated based on a different portion of the coded packet than the first symbol block, and wherein the plurality of symbol blocks are selected for transmission, one symbol block at a time, until an acknowledgement (ACK) is received for the data packet or all of the plurality of symbol blocks are transmitted, and wherein the second symbol block is selected for transmission when the ACK is not received for the data packet.

11. The transmitter of claim 10, wherein the transmit data processor is operative to partition the coded packet into a plurality of coded subpackets, and modulate the plurality of coded subpackets in accordance with the particular modulation scheme indicated by the selected rate to obtain the plurality of symbol blocks.

12. The transmitter of claim 10, further comprising:
a transmit spatial processor operative to receive a symbol block to be transmitted and provide output symbols to the plurality of transmit antennas.

13. An apparatus operative to perform incremental redundancy (IR) transmission in a wireless multiple-input multiple-output (MIMO) communication system, comprising:
means for obtaining a selected rate for data transmission on a MIMO channel between a plurality of transmit antennas and a plurality of receive antennas, the selected rate indicating a particular data rate, or a particular coding scheme, or a particular code rate, or a particular modulation scheme, or a particular data packet size, or a combination thereof;
means for encoding a data packet in accordance with the selected rate to obtain a coded packet;
means for processing the coded packet to obtain a plurality of symbol blocks, each symbol block being generated based on a different portion of the coded packet;
means for transmitting a first symbol block of the plurality of symbol blocks from the plurality of transmit antennas to the plurality of receive antennas; and
means for transmitting a second symbol block of the plurality of symbol blocks from the plurality of transmit antennas to the plurality of receive antennas, wherein the second symbol block is generated based on a different portion of the coded packet than the first symbol block, and wherein the plurality of symbol blocks are selected for transmission, one symbol block at a time, until an acknowledgement (ACK) is received for the data packet or all of the plurality of symbol blocks are transmitted, and wherein the second symbol block is selected for transmission when the ACK is not received for the data packet.

14. The apparatus of claim 13, wherein the means for processing includes
means for partitioning the coded packet into a plurality of coded subpackets, and
means for modulating the plurality of coded subpackets in accordance with the particular modulation scheme indicated by the selected rate to obtain the plurality of symbol blocks.

15. A method of receiving an incremental redundancy (IR) transmission in a wireless multiple-input multiple-output (MIMO) communication system, comprising:
receiving a first data symbol block transmitted from a plurality of transmit antennas and received by a plurality of receive antennas:
receiving a second data symbol block transmitted from the plurality of transmit antennas and received by the plurality of receive antennas, wherein the second data symbol block is generated based on a different portion of a coded packet for a data packet than the first symbol block, and wherein the first data symbol block and the second data symbol block are part of a plurality of data symbol blocks for the data packet, each data symbol block comprising a different portion of the coded packet for the data packet;
obtaining a block of detected symbols for the first data symbol block, the block of detected symbols being an estimate of the first data symbol block;
decoding all detected symbol blocks obtained for the data packet to provide a decoded packet;
determining whether the decoded packet is correct or in error; and
repeating the receiving, obtaining, decoding, and determining for another one of the plurality of data symbol blocks if the decoded packet is in error, wherein at least one of the plurality of data symbol blocks is received, one data symbol block at a time, until the data packet is decoded correctly or all of the plurality of data symbol blocks are received, and wherein a next data symbol block among the plurality of data symbol blocks is received if the data packet is decoded in error.

16. The method of claim 15, further comprising:
obtaining a block of received symbols corresponding to the data symbol block; and
processing the received symbol block to obtain the detected symbol block.

17. The method of claim 16, wherein the processing the received symbol block comprises processing the received symbol block based on a minimum mean square error (MMSE) detector, or a maximal ratio combining (MRC) detector, or a linear zero-forcing (ZF) detector, or a combination thereof.

18. The method of claim 15, further comprising:
terminating the receiving, obtaining, decoding, and determining if the decoded packet is correct or if the plurality of data symbol blocks for the data packet have been received.

19. The method of claim 15, further comprising:
sending an acknowledgment (ACK) for the second data symbol block if the decoded packet is correct or a negative acknowledgment (NAK) if the decoded packet is in error.

20. The method of claim 15, further comprising:
deriving a signal-to-noise-and-interference ratio (SNR) estimate for each of the plurality of transmit antennas,
computing an average SNR based on SNR estimates for the plurality of transmit antennas, and
selecting a rate, based on the average SNR, for data transmission on a MIMO channel between the plurality of transmit antennas and the plurality of receive antennas, the selected rate indicating a particular data rate, or a particular coding scheme, or a particular code rate, or a particular modulation scheme, or a particular data packet size, or a combination thereof.

21. The method of claim 15, further comprising:
obtaining channel estimates for a MIMO channel between the plurality of transmit antennas and the plurality of receive antennas; and
selecting, based on the channel estimates, a rate for data transmission on the MIMO channel.

22. A method of receiving an incremental redundancy (IR) transmission in a wireless multiple-input multiple-output (MIMO) communication system, comprising:
determining a rate for data transmission based on an average spectral efficiency for a plurality of transmit antennas, the rate indicating a particular data rate, or a particular coding scheme, or a particular code rate, or a particular modulation scheme, or a particular data packet size, or a combination thereof;
obtaining a block of detected symbols for a data packet, wherein the detected symbol block is an estimate of receiving a first data symbol block transmitted from the plurality of transmit antennas and received by a plurality of receive antennas, wherein the first data symbol block is one of a plurality of data symbol blocks for a data packet, wherein the plurality of data symbol blocks for a data packet comprise at least the first data symbol block and a second data symbol block wherein the second data symbol block is generated based on a different portion of a coded packet for the data packet than the first symbol block;
obtaining a block of detected symbols for the first data symbol block, the block of detected symbols being an estimate of the first data symbol block;
decoding all detected symbol blocks obtained for the data packet based on the rate to provide a decoded packet;
determining whether the decoded packet is correct or in error; and
repeating the receiving, obtaining, decoding, and determining for another one of the plurality of data symbol blocks if the decoded packet is in error, wherein at least one of the plurality of data symbol blocks is received, one data symbol block at a time, until the data packet is decoded correctly or all of the plurality of data symbol blocks are received, and wherein a next data symbol block among the plurality of data symbol blocks is received if the data packet is decoded in error.

23. A receiver operative to receive an incremental redundancy (IR) transmission in a wireless multiple-input multiple-output (MIMO) communication system, comprising:
a receive data processor operative to
receive a first data symbol block transmitted from a plurality of transmit antennas and received by a plurality of receive antennas;
receive a second data symbol block transmitted from the plurality of transmit antennas and received by the plurality of receive antennas, wherein the second data symbol block is generated based on a different portion of a coded packet for a data packet than the first symbol block, and wherein the first data symbol block and the second data symbol block are part of a plurality of data symbol blocks for the data packet, each data symbol block comprising a different portion of the coded packet for the data packet,
obtain a block of detected symbols for the first data symbol block, the block of detected symbols being an estimate of the first data symbol block,
decode all detected symbol blocks obtained for the data packet to provide a decoded packet, and
determine whether the decoded packet is correct or in error; and
a controller operative to, if the decoded packet is in error, direct the receive data processor to repeat receiving another data symbol block, obtaining another block of detected symbols, decoding all detected symbol blocks, and determining whether the decoded packet is correct or in error, wherein at least one of the plurality of data symbol blocks is received, one data symbol block at a time, until the data packet is decoded correctly or all of the plurality of data symbol blocks are received, and wherein a next data symbol block among the plurality of data symbol blocks is received if the data packet is decoded in error.

24. The receiver of claim 23, further comprising:
a receive spatial processor operative to obtain a block of received symbols for the data symbol block and to process the received symbol block to obtain the detected symbol block.

25. The receiver of claim 23, further comprising:
a channel estimator operative to obtain channel estimates for a MIMO channel between the plurality of transmit antennas and the plurality of receive antennas; and
a rate selector operative to select, based on the channel estimates, a rate for data transmission on the MIMO channel.

26. An apparatus for receiving an incremental redundancy (IR) transmission in a wireless multiple-input multiple-output (MIMO) communication system, comprising:
means for receiving a first data symbol block transmitted from a plurality of transmit antennas and received by a plurality of receive antennas;

means for receiving a second data symbol block transmitted from the plurality of transmit antennas and received by the plurality of receive antennas, wherein the second data symbol block is generated based on a different portion of a coded packet for a data packet than the first symbol block, wherein the first data symbol block and the second data symbol block are part of a plurality of data symbol blocks for the data packet, each data symbol block comprising a different portion of the coded packet for the data packet;

means for obtaining a block of detected symbols for the first data symbol block, the block of detected symbols being an estimate of the first data symbol block;

means for decoding all detected symbol blocks obtained for the data packet to obtain a decoded packet;

means for determining whether the decoded packet is correct or in error; and means for repeating the receiving, obtaining, decoding, and determining for another one of the plurality of data symbol blocks if the decoded packet is in error, wherein at least one of the plurality of data symbol blocks is received, one data symbol block at a time, until the data packet is decoded correctly or all of the plurality of data symbol blocks are received, and wherein a next data symbol block among the plurality of data symbol blocks is received if the data packet is decoded in error.

27. The apparatus of claim 26, further comprising:
means for obtaining a block of received symbols for the data symbol block; and
means for processing the received symbol block to obtain the detected symbol block.

28. The apparatus of claim 26, further comprising:
means for obtaining channel estimates for a MIMO channel between the plurality of transmit antennas and the plurality of receive antennas; and
means for selecting, based on the channel estimates, a rate for data transmission on the MIMO channel.

29. A method of receiving an incremental redundancy (IR) transmission in a wireless multiple-input multiple-output (MIMO) communication system, comprising:
receiving a first data symbol block transmitted from a plurality of transmit antennas and received by a plurality of receive antennas;
receiving a second data symbol block transmitted from the plurality of transmit antennas and received by the plurality of receive antennas, wherein the second data symbol block is generated based on a different portion of a coded packet for a data packet than the first symbol block, wherein the first data symbol block and the second data symbol block are part of a plurality of data symbol blocks for the data packet, each data symbol block comprising a different portion of the coded packet for the data packet;
obtaining a block of received symbols for the first data symbol block;
detecting all received symbol blocks received for the data packet to obtain detected symbol blocks, one detected symbol block for each received symbol block;
decoding all detected symbol blocks for the data packet to obtain decoder feedback information;
performing the detecting and decoding for a plurality of iterations, wherein the decoder feedback information from the decoding for a current iteration is used by the detecting for a subsequent iteration; and
generating a decoded packet based on an output from the decoding for a last iteration among the plurality of iterations, wherein at least one of the plurality of data symbol blocks is received, one data symbol block at a time, until the data packet is decoded correctly or all of the plurality of data symbol blocks are received, and wherein a next data symbol block among the plurality of data symbol blocks is received if the data packet is decoded in error.

30. The method of claim 29, further comprising:
determining whether the decoded packet is correct or in error; and
obtaining, detecting, decoding, performing, and generating for another one of the plurality of data symbol blocks if the decoded packet is in error and if all of the plurality of data symbol blocks have not been received.

31. The method of claim 29, wherein the detecting is based on a minimum mean square error (MMSE) detector, or a maximal ratio combining (MRC) detector, or a linear zero-forcing (ZF) detector, or a combination thereof.

32. The method of claim 31, wherein the MMSE detector is used for the detecting for at least one iteration and the MRC detector or the ZF detector is used for the detecting after the at least one iteration.

33. The method of claim 29, further comprising:
obtaining channel estimates for a MIMO channel between the plurality of transmit antennas and the plurality of receive antennas; and
selecting, based on the channel estimates, a rate for data transmission on the MIMO channel.

34. A receiver operative to receive an incremental redundancy (IR) transmission in a wireless multiple-input multiple-output (MIMO) communication system, comprising:
a buffer operative to receive and store a block of received symbols for each of a first and second data symbol block transmitted from a plurality of transmit antennas and received by a plurality of receive antennas, wherein the second data symbol block is generated based on a different portion of a coded packet for a data packet than the first symbol block, and wherein the first data symbol block and the second data symbol block are part of a plurality of data symbol blocks for the data packet, each data symbol block comprising a different portion of the coded packet for the data packet;
a detector operative to detect all received symbol blocks received for the data packet to obtain detected symbol blocks, one detected symbol block for each received symbol block; and
a decoder operative to decode all detected symbol blocks for the data packet to obtain decoder feedback information,
wherein the detector and decoder are operative to perform detection and decoding for a plurality of iterations, wherein the decoder feedback information from the decoder for a current iteration is used by the detector for a subsequent iteration, wherein a decoded packet is generated based on output from the decoder for a last iteration among the plurality of iterations, wherein at least one of the plurality of data symbol blocks is received, one data symbol block at a time, until the data packet is decoded correctly or all of the plurality of data symbol blocks are received, and wherein a next data symbol block among the plurality of data symbol blocks is received if the data packet is decoded in error.

35. The receiver of claim 34, further comprising:
a controller operative to, if the decoded packet is in error and if all of the plurality of data symbol blocks have not been received, direct the buffer to receive and store another received symbol block for another one of the plurality of data symbol blocks, and to direct the detector and the decoder to perform detection and decoding on all received symbol blocks received for the data packet to obtain the decoded packet.

36. The receiver of claim 34, further comprising:
a channel estimator operative to obtain channel estimates for a MIMO channel between the plurality of transmit antennas and the plurality of receive antennas; and
a rate selector operative to select, based on the channel estimates, a rate for data transmission on the MIMO channel.

37. An apparatus for receiving an incremental redundancy (IR) transmission in a wireless multiple-input multiple-output (MIMO) communication system, comprising:
a first data symbol block transmitted from a plurality of transmit antennas and received by a plurality of receive antennas;
a second data symbol block transmitted from the plurality of transmit antennas and received by the plurality of receive antennas, wherein the second data symbol block is generated based on a different portion of a coded packet for a data packet than the first symbol block, wherein the first data symbol block and the second data symbol block are part of a plurality of data symbol blocks for the data packet, each data symbol block comprising a different portion of the coded packet for the data packet;
means for obtaining a block of received symbols for the first data symbol block;
means for detecting all received symbol blocks received for the data packet to obtain detected symbol blocks, one detected symbol block for each received symbol block;
means for decoding all detected symbol blocks for the data packet to obtain decoder feedback information;
means for performing the detecting and decoding for a plurality of iterations, wherein the decoder feedback information from the decoding for a current iteration is used by the detecting for a subsequent iteration; and
means for generating a decoded packet based on decoder output from the decoding for a last iteration among the plurality of iterations, wherein at least one of the plurality of data symbol blocks is received, one data symbol block at a time, until the data packet is decoded correctly or all of the plurality of data symbol blocks are received, and wherein a next data symbol block among the plurality of data symbol blocks is received if the data packet is decoded in error.

38. The apparatus of claim 37, further comprising:
means for determining whether the decoded packet is correct or in error; and
obtaining, detecting, decoding, performing, and generating for another one of the plurality of data symbol blocks if the decoded packet is in error and all of the plurality of data symbol blocks have not been received.

39. The apparatus of claim 37, further comprising:
means for obtaining channel estimates for a MIMO channel between the plurality of transmit antennas and the plurality of receive antennas; and
means for selecting, based on the channel estimates, a rate for data transmission on the MIMO channel.

40. A method of receiving a data transmission in a wireless multiple-input multiple-output (MIMO) communication system, comprising:
detecting received symbols for a data packet to obtain detected symbols, wherein the received symbols comprise at least a first symbol and a second symbol wherein the second symbol is generated based on a different portion of a coded packet for a data packet than the first symbol block;
decoding the detected symbols to obtain decoder feedback information;
performing the detecting and decoding for a plurality of iterations, wherein the decoder feedback information from the decoding for a current iteration is used by the detecting for a subsequent iteration, wherein the detecting is performed based on a minimum mean square error (MMSE) detector for at least one iteration initially, and thereafter based on a maximal ratio combining (MRC) detector or a linear zero-forcing (ZF) detector for remaining ones of the plurality of iterations; and
generating a decoded packet based on an output from the decoding for a last iteration among the plurality of iterations.

41. The method of claim 40, wherein the detecting is performed based on the MMSE detector for only a first iteration and based on the MRC detector or the ZF detector for remaining ones of the plurality of iterations.

42. The method of claim 40, further comprising:
obtaining channel estimates for a MIMO channel between the plurality of transmit antennas and the plurality of receive antennas; and
selecting, based on the channel estimates, a rate for data transmission on the MIMO channel.

43. A non-transitory processor-readable medium encoded with instructions capable of being executed by a processor for transmitting data in a wireless multiple-input multiple-output (MIMO) communication system, comprising codes executable to
obtain a selected rate for data transmission on a MIMO channel between a plurality of transmit antennas and a plurality of receive antennas, the selected rate indicating a particular data rate, or a particular coding scheme, or a particular code rate, or a particular modulation scheme, or a particular data packet size, or a combination thereof;
encode a data packet in accordance with the selected rate to obtain a coded packet;
process the coded packet to obtain a plurality of symbol blocks, each symbol block being generated based on a different portion of the coded packet;
send a first symbol block of the plurality of symbol blocks from the plurality of transmit antennas to the plurality of receive antennas; and
send a second symbol block of the plurality of symbol blocks from the plurality of transmit antennas to the plurality of receive antennas, wherein the second symbol block is generated based on a different portion of the coded packet than the first symbol block, wherein the plurality of symbol blocks are selected for transmission, one symbol block at a time, until an acknowledgement (ACK) is received for the data packet or all of the plurality of symbol blocks are transmitted, and wherein the second symbol block is selected for transmission when the ACK is not received for the data packet.

44. A non-transitory processor-readable medium encoded with instructions capable of being executed by a processor for receiving data in a wireless multiple-input multiple-output (MIMO) communication system, comprising codes executable to
receive a first data symbol block transmitted from a plurality of transmit antennas and received by a plurality of receive antennas;
receive a second data symbol block transmitted from the plurality of transmit antennas and received by the plurality of receive antennas, wherein the second data symbol block is generated based on a different portion of a coded packet for a data packet than the first symbol block, wherein the first data symbol block and the second data symbol block are part of a plurality of data symbol blocks for the data packet, each data symbol block comprising a different portion of the coded packet for the data packet;

obtain a block of detected symbols for the first data symbol block, the block of detected symbol block being an estimate of the first data symbol block;

decode all detected symbol blocks obtained for the data packet to provide a decoded packet;

determine whether the decoded packet is correct or in error; and repeat receiving, obtaining, decoding, and determining for another one of the plurality of data symbol blocks if the decoded packet is in error, wherein at least one of the plurality of data symbol blocks is received, one data symbol block at a time, until the data packet is decoded correctly or all of the plurality of data symbol blocks are received, and wherein a next data symbol block among the plurality of data symbol blocks is received if the data packet is decoded in error.

* * * * *